US007116816B2

(12) United States Patent
Tanaka et al.

(10) Patent No.: US 7,116,816 B2
(45) Date of Patent: Oct. 3, 2006

(54) METHOD OF INSPECTING A PATTERN AND AN APPARATUS THEREOF AND A METHOD OF PROCESSING A SPECIMEN

(75) Inventors: Maki Tanaka, Yokohama (JP); Takashi Hiroi, Yokohama (JP); Masahiro Watanabe, Yokohama (JP); Chie Shishido, Yokohama (JP); Hiroshi Morioka, Yokohama (JP); Kenji Watanabe, Oume (JP); Hiroshi Miyai, Hitachi (JP); Mari Nozoe, Hino (JP)

(73) Assignee: Hitachi, Ltd., Tokyo (JP)

( * ) Notice: Subject to any disclaimer, the term of this patent is extended or adjusted under 35 U.S.C. 154(b) by 764 days.

(21) Appl. No.: 09/793,922

(22) Filed: Feb. 28, 2001

(65) Prior Publication Data

US 2001/0033683 A1    Oct. 25, 2001

(30) Foreign Application Priority Data

Apr. 25, 2000  (JP) .............................. 2000-128954

(51) Int. Cl.
G06K 9/00    (2006.01)

(52) U.S. Cl. ..................... 382/149; 382/172; 250/305; 250/306; 356/237.2

(58) Field of Classification Search ................ 382/144, 382/149, 145, 141, 172; 250/305, 310, 307, 250/397, 330, 306; 348/87, 126; 356/394, 356/448, 237.2, 338, 445
See application file for complete search history.

(56) References Cited

U.S. PATENT DOCUMENTS 4,677,296 A * 6/1987 Lischke et al. ............. 250/310
4,891,524 A * 1/1990 Yasuda et al. .............. 250/398
4,902,967 A * 2/1990 Flesner ....................... 324/751
4,912,313 A * 3/1990 Kato et al. .................. 250/307
5,502,306 A * 3/1996 Meisburger et al. ........ 250/310
5,557,105 A * 9/1996 Honjo et al. ................ 250/310
6,081,325 A * 6/2000 Leslie et al. ............. 356/237.2
6,204,075 B1 * 3/2001 Kikuchi ....................... 438/18
6,256,093 B1 * 7/2001 Ravid et al. ............. 356/237.2
6,272,236 B1 * 8/2001 Pierrat et al. ............... 382/144
6,303,931 B1 * 10/2001 Menaker et al. ............ 250/307
6,329,826 B1 * 12/2001 Shinada et al. ............. 324/751
6,348,690 B1 * 2/2002 Iwabuchi et al. ........... 250/310
6,399,953 B1 * 6/2002 Kitamura ................. 250/491.1
6,452,677 B1 * 9/2002 Do et al. ..................... 356/394
6,504,393 B1 * 1/2003 Lo et al. ..................... 324/765
6,697,517 B1 * 2/2004 Hunter ....................... 382/149

* cited by examiner

Primary Examiner—Sheela Chawan
(74) Attorney, Agent, or Firm—Antonelli, Terry, Stout and Kraus, LLP.

(57) ABSTRACT

In order to enable the most suitable image processing condition to be set as one in which a dispersion in brightness between comparing images caused by object to be inspected and an image detecting system is not applied as a false information, in the present invention, there is obtained a noise characteristic of a secondary electron image caused by the image detecting system is calculated, the most suitable image processing parameters are determined depending on the object to be inspected on the basis of the characteristic, and its comparing processing is performed by using the noise characteristic and the image of the object to be inspected, thereby a dispersion in process for the object to be inspected is evaluated.

23 Claims, 24 Drawing Sheets

EXAMPLE OF THRESHOLD VALUE SETTING
WITH INSPECTION SENSITIVITY 1

EXAMPLE OF THRESHOLD VALUE SETTING
WITH INSPECTION SENSITIVITY 2

OUTPUT EVALUATION AT DEFECT

DISCRIMINATION OF DEFECT

NO CONVERSION OF GRADATION

AFTER CONVERSION OF BRIGHTNESS

METHOD OF INSPECTING A PATTERN AND AN APPARATUS THEREOF AND A METHOD OF PROCESSING A SPECIMEN

CROSS REFERENCE TO RELATED APPLICATIONS

This application is related to U.S. application Ser. No. 09/848,422, filed May 4, 2001, now U.S. Pat. No. 6,376,854, which is a continuation of U.S. application Ser. No. 09/610, 954, filed Jul. 6, 2000, now U.S. Pat. No. 6,236,057, which is a continuation of U.S. application Ser. No. 09/081,636, filed May 20, 1998, now U.S. Pat. No. 6,087,673, which applications were filed by some of the inventors herein.

BACKGROUND OF THE INVENTION

Field of the Invention

This invention relates to a method of inspecting a pattern, an apparatus for inspecting a pattern and a method for manufacturing a specimen under application of this inspecting method which are suitable for monitoring a manufacturing process by detecting a defect produced on the specimen or a variation in processing of the specimen by using an electron image, in particular, during a step for forming a pattern on the specimen, by analyzing them and applying results of the analyzing operation, for example, at a semiconductor manufacturing process, and processes for manufacturing a TFT (Thin Film Transistor) liquid crystal display device, a PDP (Plasma Display Panel), and a photo-mask, etc.

As a trend of high integration of a semiconductor integrated circuit device nowadays, a circuit pattern formed on a semiconductor wafer is rapidly changed into a fine minute size. Accordingly, a further high sensitivity has been required in an inspection device for a circuit pattern.

In general, when patterns formed on the surface of a specimen are inspected, a method for detecting a certain defect on the surface by detecting the pattern images and processing these images under application of an optical microscope or an electron microscope, etc. is used.

As already disclosed in the gazette of Japanese Patent Laid-Open No.Sho 57-196377, it has been known in the prior art for performing an inspection of patterns formed on the surface of the specimen to provide an inspection technology that the patterns of an inspected object such as a semiconductor wafer containing some repeated patterns are detected, the detected patterns are stored, the detected pattern is compared with a pattern just already stored prior to the former and a non-coincidence between these patterns is extracted.

When such an inspection system using this image comparison as above is operated, a defect may easily be detected if quite the same images to each other are obtained at the two comparing locations and a co-incidence occurs only at the defect.

However, actually, even the normal parts may produce non-coincidence that does not become a defect between the two comparing images due to a slight difference that does not become defect of the inspected object and the noise etc. of the image detection system. Because this non-coincidence becomes a noise in the defect detection based on the image comparison, how to decrease these non-coincidences becomes an issue for attaining improvement of sensitivity.

In the gazette of Japanese Patent Laid-Open No.Hei 3-177040, there is disclosed a method in which an inter-image positional displacement of these non-coincidences caused at the image detecting system due to vibration of the device or miss-alignment between the image detected positions is restricted to a size less than that of a pixel so as to reduce the non-coincidence between the comparison images.

Moreover, in the gazette of Japanese Patent Laid-Open No.Hei 10-318950 is disclosed means for allowing a tolerance for the non-coincidence due to variation in shape of the inspected object in addition to the non-coincidence of the above-mentioned image detection system so as to suppress any occurrence of nuisance.

Although some of the inspection devices are operated under application of an image comparison and utilization of an optical microscope, its sensitivity is improved by devising the image applied for the inspection together with a sensitivity improvement caused by improving the comparing system as described above.

As one of the methods described above, there is provided a scanning electron microscope (hereinafter called as an SEM) because it has a high resolution in view of its principle and a difference in electrical characteristic can be obtained as an image, and so in recent years, its necessity for this electron microscope has been increased.

As a technology that is related to this processing, the gazette of Japanese Patent Laid-Open No.Hei 5-258703 discloses both a method and a system for inspecting an X-ray mask or a pattern formed on a conductive specimen that is equal to the mask under application of the SEM.

The inventions in the prior art disclosed in each of the gazettes of Japanese Patent Laid-Open No. Sho 57-196377, Nos. Hei 3-177040 and Hei 10-318950 disclose a process for decreasing influence of the non-coincidence of the images due to vibration of a stage or mis-alignment in two image detecting positions and the non-coincidence of the images caused by variation in shape of the inspected object. However, these prior arts do not provide any clear countermeasure against the non-coincidence generated by the variation in brightness caused by the inspected object or the image detecting system.

The non-coincidence which originates in the inspected object among the aforesaid inter-comparison image non-coincidences shows a non-uniformness of the structure of the object, and when its degree is severe, the product becomes a defective product. If this non-uniformness can be quantitatively evaluated, it may become an index that monitors the process change in the manufacturing step. However, it is frequently found difficult to discriminate it from the non-coincidence caused by the image detecting system.

To the contrary, the non-coincidence caused by the image detecting system becomes a noise when the defect is discriminated, and this defect may decrease the inspection performance, so that it is important to suppress the non-coincidence as much as possible. Moreover, it is preferable that the non-coincidence that originates in this image detection system can be evaluated in view of its quantity so as to evaluate the non-coincidence caused by the object due to the fact that the non-coincidence caused by the object and the non-coincidence caused by the image detecting system are merged to each other.

The SEM type inspection device operated under application of the electron-beam, in particular, shows a brightness dispersion specific to the secondary electron image and this dispersion is a major cause of non-coincidence caused by the image detecting system. However, the brightness dispersion specific to the electron image is caused by the fluctuation in the number of electrons in the primary electron-beam and it is difficult to suppress it in view of its principle.

SUMMARY OF THE INVENTION

In accordance with the present invention, there are provided an inspecting method and an inspecting apparatus in which the most suitable image processing condition for attaining the performance of the inspecting device as much as possible can be set by evaluating the brightness variation caused by either the inspected object or the image detecting system.

Additionally, in accordance with the present invention, there is provided a method for manufacturing the processed item in a stable manner under a state in which its specified quality is being maintained by estimating a dispersion of specific signal of the electron-beam image, quantitatively evaluating the brightness dispersion caused by the inspected object and monitoring the variation in process for the object.

In order to solve the above-mentioned problem, the present invention, at first, forms a cause of producing brightness dispersion caused by the image detecting system into a certain model. The noise characteristic caused by the image detection system is recognized by measuring and quantifying a brightness dispersion in the actual device in reference to this model.

Moreover, the brightness dispersion caused by the inspected object at the normal part, that is, the characteristic dispersion in the object itself or dispersion of the structure is evaluated quantitatively under application of a comparing processing of the image at the normal part of the inspected object having a repeated pattern and also under application of noise characteristic caused in the image detecting system calculated by the aforesaid means. Moreover, a continuous evaluation of the brightness dispersion, caused by the inspected object, of the inspected object of the same product and the same step causes the variation in process for the manufacturing line to be monitored and realize an early finding of the irregular state of the object.

In addition, an image processing condition for attaining the maximum degree of performance of the inspection device is set under application of both means for displaying the non-coincidence of the inspection images in a visual clear manner and information of non-coincidence, by setting the minimum inspection threshold in which the non-coincidence not being defect is not detected.

Moreover, a state of the device is monitored and default condition of the device is detected by applying a continuous evaluation of the state of the non-coincidence caused by the image detection system and then the brightness dispersion caused by the inspected object is always evaluated in a stable manner.

These and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
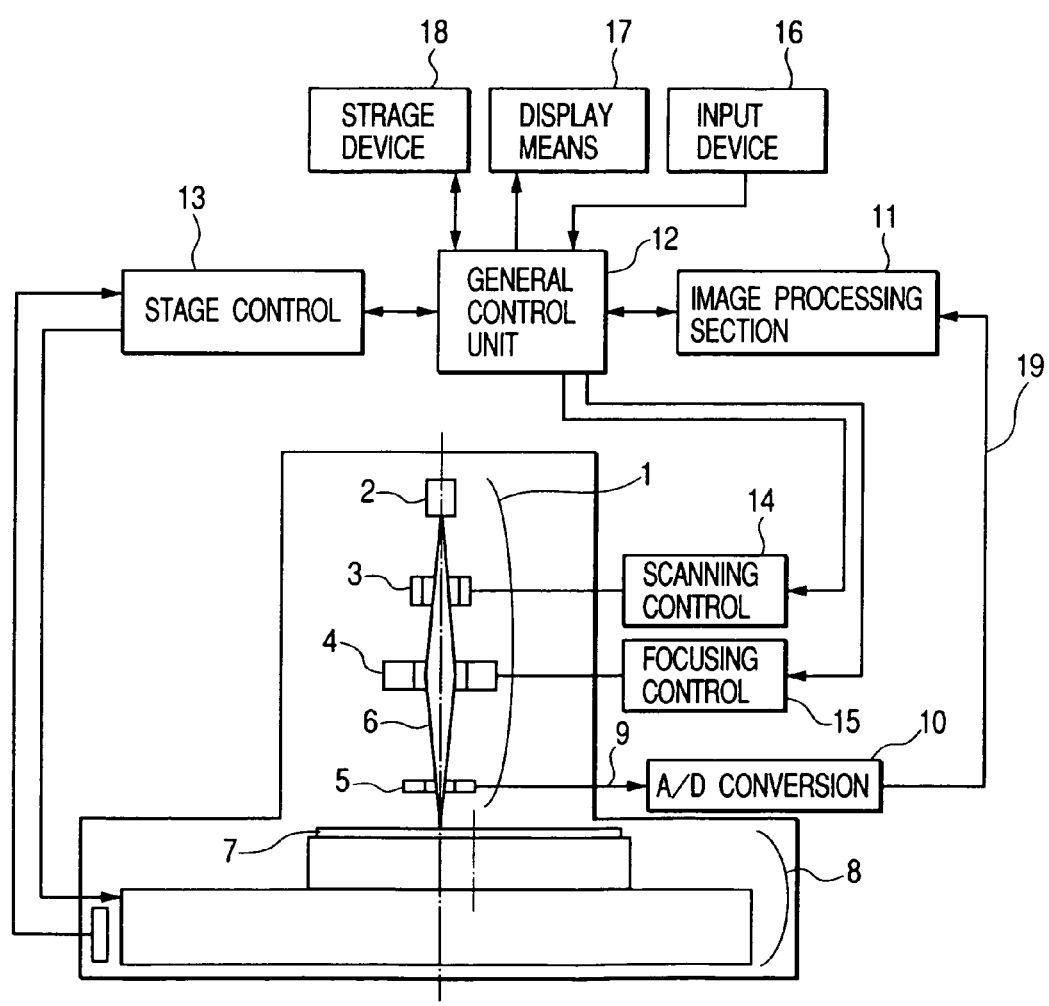
FIG. 1 is a front elevational view for showing a schematic constitution of one preferred embodiment of the electron-beam device of the present invention.

Referring now to the drawings, the preferred embodiments of the present invention will be described as follows.

FIG. 1 shows an entire constitution of device in the preferred embodiment of the present invention.

FIG. 1 is a constitution view of the automatic inspection device of the SEM type, and as for SEM part 1, this is comprised of an electron gun 2 which contains electron source, a deflection system 3, a condenser lens system 4, and a secondary electron sensor 5, and the primary electron beams (the electron-beams) 6 which are condensed from SEM part 1 are irradiated to the inspected object 7. The inspected object 7 is held on a stage 8 that can be moved continuously, and the secondary electron image on surface of the inspected object 7 can be obtained by combining a scanning of the primary electron beam 6 and a motion of the stage 8. Stage 8 can move the inspected object 7 within a plane.

After the obtained second electronic signal 9 is converted into a digital signal by an A/D converter 10, it is inputted to an image processing part 11 as an electron beam image 19. Image processing part 11 has a function to evaluate the defect detection and image quality by processing the secondary electron image acquired by SEM part 1. The image processing result obtained by SEM part 1 and image-processing part 11 is inputted to the general control unit 12.

The general control unit 12 generally controls a stage controller 13 that includes a length measuring unit, a scanning controller 14, and a focus control system 15, and has the function to input the secondary electron image under the best condition by using these devices. Moreover, this device is connected with the general control unit 12, and has the input device 16 for accepting instruction from a user, the display means 17 to display the state of the device and the inspection results, and memory 18. The general control unit 12 has the function for controlling each of the elements to perform inputting of the secondary electron image, and further setting an appropriate image processing condition according to the image obtained from SEM part 1 against image processing part 11, and inspects the pattern according to the set image processing condition. Details of this image processing condition-setting function are described later.

Figure 2:
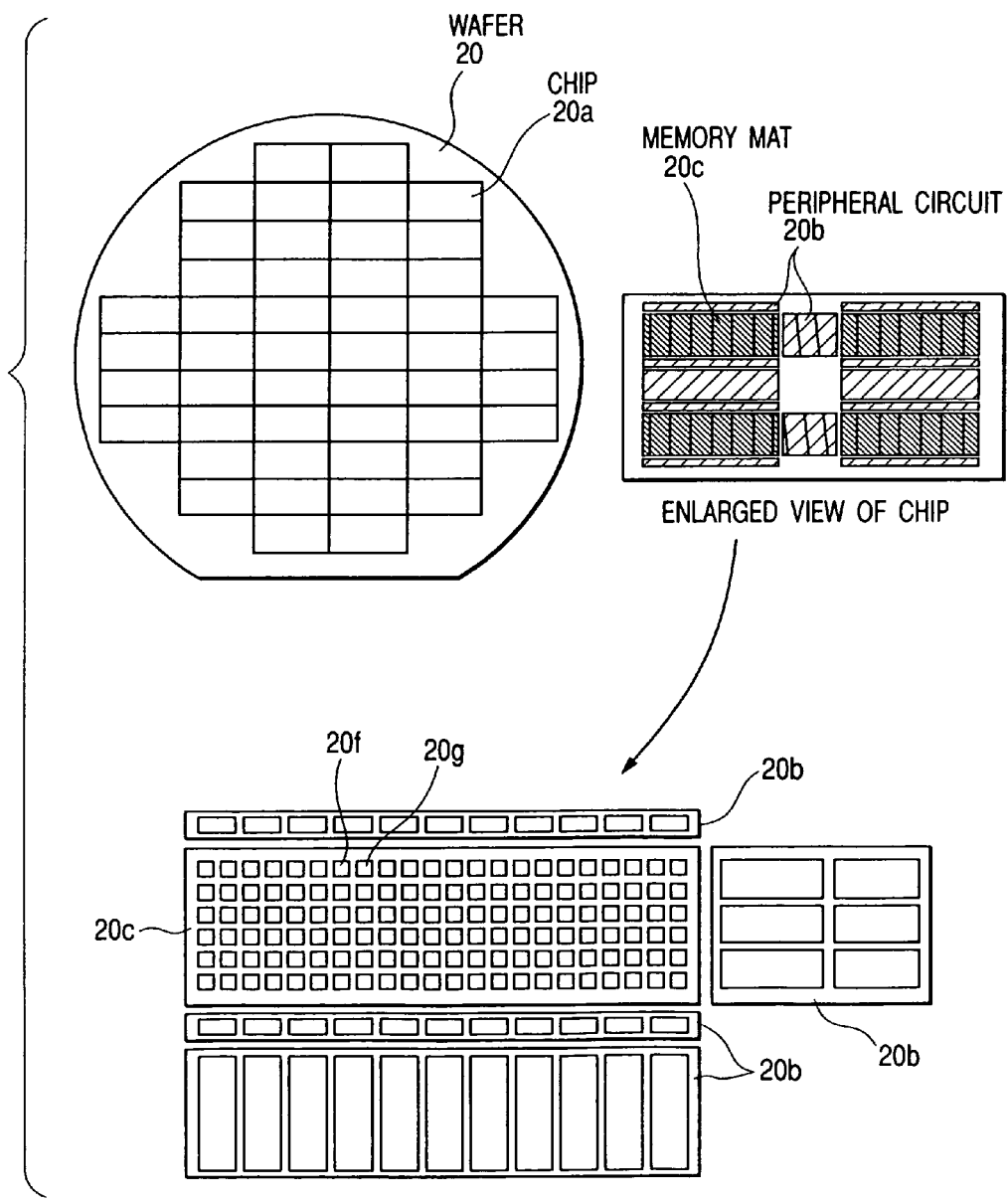
FIG. 2 is a plan view of the wafer that shows the layout of the semiconductor wafer shown as one example of the inspected object in the present invention.

As the inspected object 7, there is provided a semiconductor wafer 20 shown in FIG. 2, for example. A lot of chips 20a or which become finally the same product are arranged at this semiconductor wafer 20. Pattern layout inside the chips 20a is made such that, as shown in an enlarged figure of FIG. 2, this is comprised of the memory mat 20c having memory cells regularly arranged in equal Pitch in two-dimensional manner and the peripheral circuit 20b. In the case that the present invention is applied to an inspection of pattern of the semiconductor wafer 20, the detected image in a certain chip (for example, a chip 20d) is stored in advance and compared with the detected image at another chip (for example, a chip 20e) (hereinafter called as "a comparison inspection", or the detected image at a certain memory cell (for example, a cell 20f) is stored in advance and compared with a detected image at another cell (for example, a cell 20g) (hereinafter called as "cell-to-cell comparison inspection", thereby the defect is recognized.

If it is assumed that the repeated patterns of the inspected object 7 (for example, if the semiconductor wafer is applied as an example, the chips by themselves or cells by themselves) are strictly equal to each other and equal detected images can be obtained, only the defect becomes non-coincidence when the images are compared to each other, resulting in that recognition of the defect may become easy.

However, the non-coincidence between both images actually exists in the normal part. The non-coincidence at the normal part includes the non-coincidence that originates in the inspected object and the non-coincidence that originates in the image detection system. The non-coincidence that originates in the inspected object is caused by a slight difference between the repeated patterns which are generated through the wafer production processes such as exposure, development, and etching, or the like. This appears as a minute difference of a pattern shape and a difference in brightness on the detected image.

As the non-coincidence which originates in the image detection system, there are a noise caused by the vibration of the stage etc. or a noise caused by a displacement between the detected positions of the two images or other various kinds of noises and in particular, in the case of the SEM type inspection device using the secondary electron signal 9, there is a noise caused by a dispersion in brightness specific to the electron image. This appears on the detection image as the difference in brightness of the partial image, the distortion of the pattern, and difference in position of the image.

The non-coincidence that originates in the object shows structural uniformity of the object, and when the level is severe, it becomes defective. If this non-coincidence can be quantitatively evaluated, it may become an index for monitoring the change in the manufacturing process. However, it occurs frequently that it becomes difficult to attain the separation with the non-coincidence that originates in the image detection system.

On the other hand, it is important to suppress the non-coincidence that originates in the image detection system small as much as possible because it becomes a noise when the defect is determined, and because the inspection performance is decreased. Moreover, as described above, it is preferable that the non-coincidence that originates in this image detection system can be quantified to evaluate the non-coincidence that originates in the object. The non-coincidence between the images because of a vibration of the stage and a displacement between the two image detection positions can be reduced by measuring the amount of positional displacement between the two images in advance and correcting the positional displacement.

However, as to the brightness dispersion specific to the electron image, this is caused by fluctuation of the number of electrons of the primary electron beam, and it is not possible to fundamentally lose it. Although it is possible to decrease noise to a certain degree by performing image detection by a plurality of times and carrying out an average setting operation, it takes much time to perform the image detecting operation and its inspection time is extended. Moreover, there is also present a problem that irradiation of beam at the same location by a plurality of times causes an electrical charging to be produced at the surface of the specimen and image quality to be changed.

The present invention provides a method for setting the most suitable image processing condition or for monitoring a variation in process by especially estimating a dispersion of signal specific to the electro image.

Figure 3:
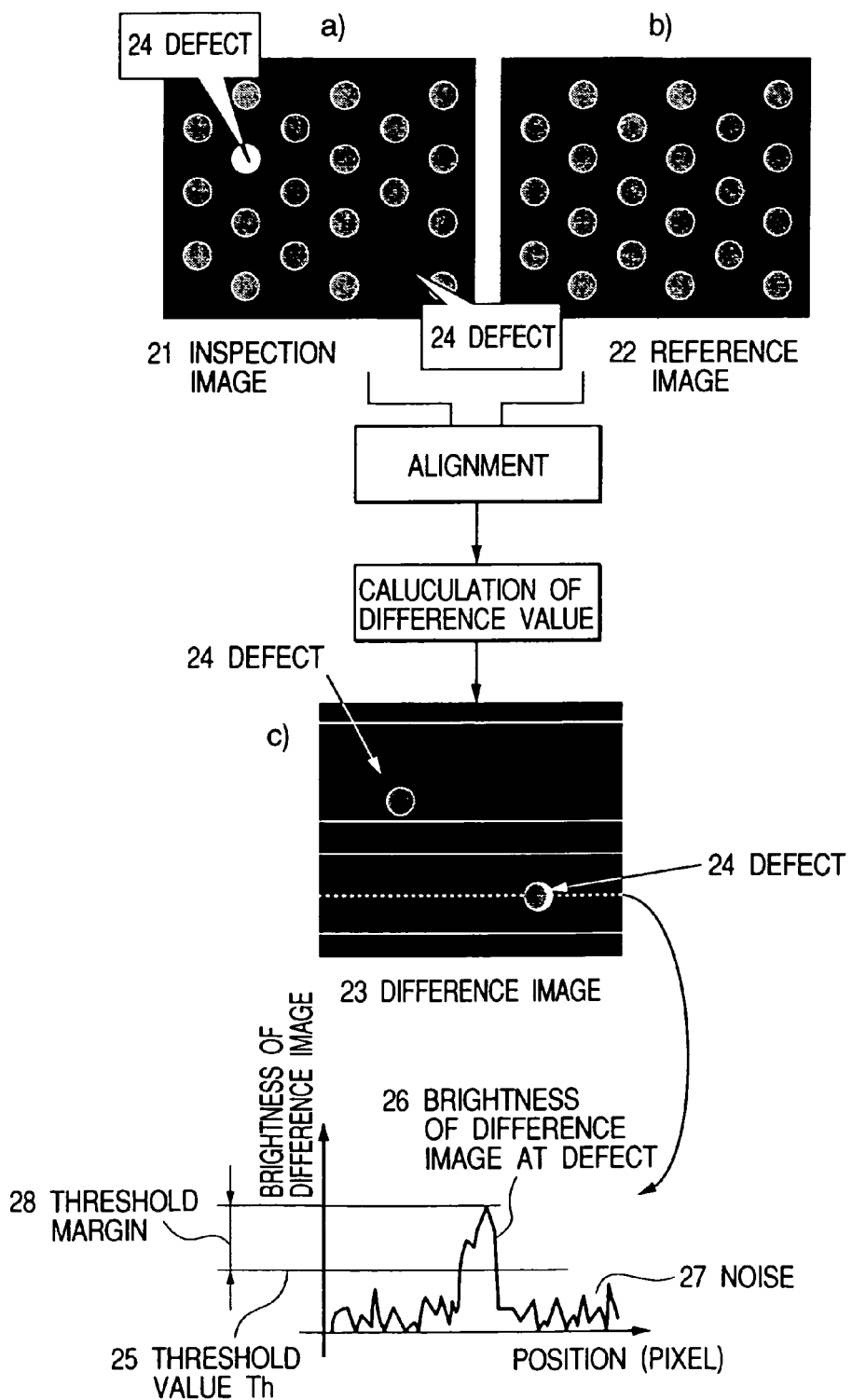
FIG. 3 is a view for showing one example of a method of detecting the defect in the present invention.

In FIG. 3 is shown one example of a comparing and inspecting method, and the problem that the present invention aims at solving will be described.

The image of surface pattern of the inspected object 7 shown in FIGS. 3a) and 3b) is acquired by SEM part 1. These two images are an image 21 at the inspection part in the inspecting position and a similar pattern image (reference numeral 22) stored in advance and placed near it. In FIG. 3a), the part where brightness and a shape of the round pattern are different corresponds to a defect 24.

In this example, these gray-level images are assumed such that at first a positional alignment of the patterns between images is performed and the non-coincidence of the images caused by the vibration of the stage previously described and the displacement in detecting positions of the two images is sufficiently restricted low. For example, this is realized by the method disclosed in the gazette of Japanese Patent Laid-Open No.Hei 3-177040, wherein a positional miss-alignment between the comparison images is suppressed to a size less than that of pixel.

If the images after their positional alignment are compared to each other for every pixel, these difference images 23 (in the example of FIG. 3 is shown an absolute value of the difference) can be acquired. As shown in FIG. 3c), brightness of the difference image is increased at the defect parts 24 and a threshold (an allowable value) 25 of these difference images 23 is set, and the place where the difference image becomes high (the brightness of difference image at defect 26) is determined as a defect, thereby it is possible to detect a difference between the two images as a defect. In this case, the non-coincidence between the comparison images which cannot be suppressed by the positional alignment done beforehand appears in the difference image as noise 27. These main non-coincidences are the one which originates in the inspected object (the non-coincidence of this inspected object is hereinafter called as "process dispersion"), the one caused by a dispersion of brightness specific to the electronic optical system and the one caused by the noise of an electric circuit or the like.

As the threshold 25, it is necessary to set a value that is smaller than the brightness of difference image at defect 26 and larger than noise 27. Normally, the threshold 25 at the time of inspection is set such that the inspection is actually carried out and an operator sets it to show a desired sensitivity. However, there remain some problems that it is necessary to set the value every time the inspected object is applied, and in particular, when the SEM type inspection device is applied, the inspection time is comparatively long, and several times of irradiation of the electronic beam to the inspected object causes the state of its surface to be changed and it requires a lot of time for the putting-out condition. In the present invention, since the noise 27 is estimated by holding the state of the device, it becomes possible to perform setting of the threshold in an easy manner. Details of the method for setting the threshold will be described later.

In the example shown in FIG. 3, although the difference image 23 is generated after the two images (21,22) to be compared are aligned in their positions in advance, as already described in the gazette of Japanese Patent Laid-Open No.Hei 10-318950, even a method for calculating the positional displacement amount in respect to the positional displacement amount less than that of pixel at each of the pixels and estimating the variation in brightness generated in response to the calculated positional displacement amount may enable an operator to obtain the difference image 23 similar to that of the case in which the positional alignment is carried out as shown in FIG. 3. In this case, it is satisfactory that the brightness change forecast from the amount of positional displacement is merely subtracted from the difference value of each pixel.

There will be described a method for estimating noises as found when the non-coincidence caused by the image detection system originating in the normal part image is decreased under application of the above-mentioned means, and when it is mainly predominant with noise in an electric system and the brightness dispersion of the electron-beam itself.

Figure 4:
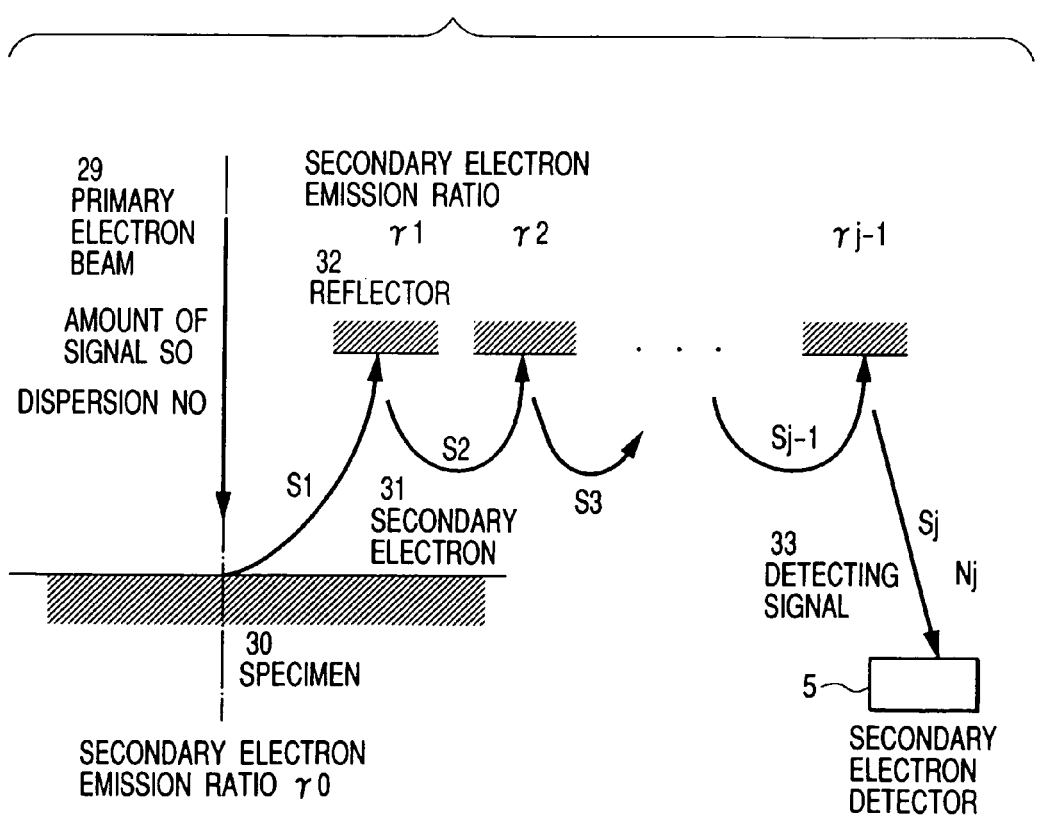
FIG. 4 is a view for illustrating the problem that should be solved in the electron-beam device in the present invention.

Referring to FIG. 4, there will be described a relation between a signal dispersion specific to the SEM image and a secondary emission ratio at the surface of the inspected object that are generated during forming of the secondary electron image.

Since it is sometimes applied to provide a reflection plate for improving or amplifying a supplementation rate of secondary electrons generated at the surface of the inspected object in accordance with the constitution of the electronic optical system, there will be considered the case that, as shown in FIG. 4, the second electrons generated at a surface of the specimen 30 are detected by the reflector of (j−1) piece (j≧1). When the reflector is not used, it is satisfactory that only a relation of j=1 has to be assumed.

As shown in FIG. 4, when the primary electron beam 29 is irradiated to a surface of the specimen 30, the secondary electrons 31 are generated in response to the secondary emission ratio γ0 of the surface of the specimen 30. At this time, if it is assumed that an amount of signal of the primary electron beam is defined as S0, the brightness dispersion of the primary electron beam itself is proportional to the square root of S0. Then, if a proportional coefficient is defined as k, the dispersion N0 of the primary electron beam becomes (Equation 1).

$$N_0 = k \cdot \sqrt{S0_0} \qquad (1)$$

If amount Sj−1 of an electronic signal irradiated to the specimen or the surface of the reflector is applied, (Equation 2), amount of signal Sj of the secondary electron generated at the surface of the specimen or at the surface of the reflector becomes like (Equation 2).

$$S_j = \gamma_{j-1} \cdot S_{j-1} \qquad (2)$$

Moreover, a brightness dispersion nj of the secondary electronic signal Sj becomes like (Equation 3) in the same manner as that of (Equation 1).

$$n_j = k \cdot \sqrt{S_j} \qquad (3)$$

The dispersion of the secondary electronic signal Sj becomes like (Equation 4) in consideration of the dispersion of signal Sj−1 before it strikes against the specimen or the reflector.

$$N_j = k \cdot \sqrt{n_j^2 + (N_{j-1} \cdot \gamma_{j-1})^2} \qquad (4)$$

When a relation between Nj and Sj is calculated under application of (Equation 1), (Equation 2), (Equation 3), and (Equation 4), and they are arranged in consideration of the fact that $\gamma_1 = \gamma_{j-1}$; the noise of detection signal Sj becomes like (Equation 5) if it is arranged in consideration of the constant of regulations.

$$N_j = k\sqrt{S_j^2/S_0 + S_j \cdot u} \qquad (5)$$

where, u is a constant.

Moreover, if the noise nc in the electric circuit (fixed element: usually this is smaller than the noise of the electron-beam), the noise Na of the signal finally detected becomes like (Equation 6).

$$Na = \sqrt{k \cdot (S_j^2/S_0 + S_j \cdot u) + n_c^2} \qquad (6)$$

Since the analog to digital conversion can be usually expressed by equation of the first degree, a relation between detected image brightness I and amount Sj of the detection signal becomes like (Equation 7).

$$I + vSj + w \quad (v,w:constant) \qquad (7)$$

where, the constant w in (Equation 7) is an image signal when the secondary electronic signal is 0 and it can be obtained by detecting the image without providing any primary electron beam radiation. Especially, this image brightness is called a shade level and a correction to subtract this shade level from the image signal where this shade level is detected is called a shade level correction. The noise component caused in an electric circuit etc. can be obtained by evaluating the noise at this shade level.

Considering this state, the brightness dispersion N of the detected image signal becomes the square root of the quadratic expression of I as indicated in (Equation 8).

$$N=\sqrt{aI^2+bI+c} \qquad (8)$$

where, a, b, c are constants.

It is possible to form a model of the occurrence of secondary electron by (Equation 8). To obtain the noise characteristic in an actual inspection device, it is satisfactory that these constants a, b, and c are calculated.

In this case, since it is an object to attain a brightness dispersion caused by the image detecting system, the image of specimen having no pattern is evaluated. It is satisfactory that the image in the part without the pattern is taken with an actual SEM type inspection device, and it is measured while the mean brightness of suitable area in the image (for instance, the area of about 50 pixels×50 pixels) and the standard deviation σ are being applied as dispersion. As the area having no pattern, it is satisfactory that a dummy wafer is used or even if the product wafer is applied, the area of relative wide and having no pattern is present. If the secondary approximated curve of second degree is calculated by a method such as a method of least square, it is possible to obtain the noise characteristic of the device (it is approximate to the curve of second degree by square of dispersion data in advance).

Figure 5:
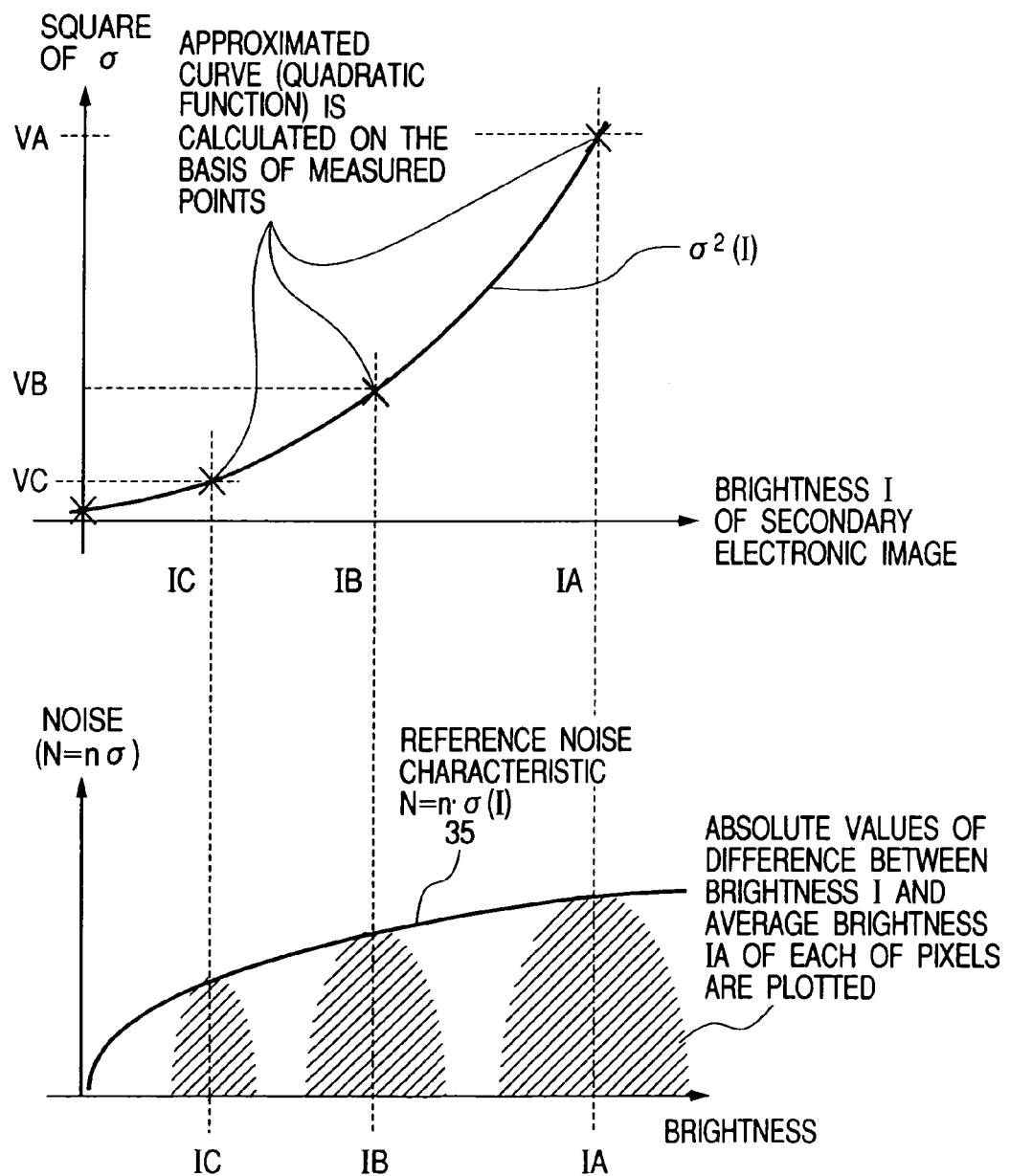
FIG. 5 is a view for illustrating the acquisition procedure of a noise characteristic of the electron-beam device in the present invention.

In the example of FIG. 5, the image is acquired under application of the specimen of three kinds of brightness, the square of the mean brightness of each image and the dispersion σ is calculated and the second curve is fitted to them. In this case, in order to calculate a coefficient of second degree, it is satisfactory that there are present at least data of three sets of brightness and dispersion. Coefficients a, b, and c can be obtained if a brightness dispersion of the shade level is applied, additional minimum two kinds of specimen are present and if a brightness dispersion of the shade level is not applied, additional minimum three kinds of specimen with different brightness are present. The standard deviation σ becomes the function of brightness I (Equation 9) if the obtained quadratic curve is defined as $a' \cdot I \cdot I+b' \cdot I+c'$.

$$\sigma(I)=\sqrt{a'I^2+b'I+c'} \qquad (9)$$

where, a', b' and c' are constants.

It is satisfactory that n is assumed to be noise N under application of suitable coefficient n for the obtained curve (for instance, N=3σ (I)). As shown in FIG. 5, in the image acquired for the evaluation of the noise characteristic, if suitable n is chosen when plotting with the difference between the brightness of each pixel and its mean value, that is, brightness, the maximum value with the brightness dispersion of each image and the noise characteristic curve can be matched. Moreover, if the threshold is decided on the basis of the obtained curve, it is satisfactory that n is determined in consideration of the allowed nuisance generation rate etc.

If N=n·σ(I) is applied, the coefficients a, b, c of the (Equation 8) may become a=n·n·a', b=n·n·b', c=n·n·c' from a', b', c' obtained through fitting.

Moreover, the noise of the difference image when there is no image non-coincidence of the inspected object on the basis of this curve can be presumed. (Equation 8) indicates a noise characteristic of the detected image itself and if this assumes the random one, the noise of the difference image becomes twice of its square root. Therefore, noise characteristic Ns of the difference image becomes (Equation 10).

$$N_s(I)+\sqrt{2} \cdot N(I)=\sqrt{2} \cdot \sqrt{aI^2+bI+c} \qquad (10)$$

Thereafter, this noise characteristic (Equation 8) is called as "reference noise characteristic 35", and (Equation 10) is called "reference noise characteristic of difference image 36" (not shown in FIG. 5). In the present invention, these noise characteristics are assumed to be a reference noise characteristic, and there is provided a method for optimizing the inspection condition and evaluating a dispersion of the process on the basis of this reference noise characteristic. Because this noise characteristic changes in the case of exchanging an electronic source and the detector, an operator measures it again for this case.

Although the noise characteristic caused by the image detection system can be obtained by the above-mentioned procedure, the noise in an actual inspection device is removed under an arrangement in which the condition of an electronic optics system is changed in response to the inspection condition, and averaging processing of plural images and a smoothing filter, etc are applied.

Although it may be applicable to acquire the image in each condition, and calculate the above-mentioned reference noise characteristic in accordance with the aforesaid procedure, it requires a troublesome operation to measure all conditions. On the other hand, there will be described a method for obtaining a reference noise characteristic in regard to other image acquisition conditions on the basis of the (Equation 8) acquired under a certain condition.

The example of the correspondence method when the amount of the current of the primary electron-beam is changed will be described as follows.

In particular, in the case that a shade level correction is performed (when w=0 in (Equation 7) is applied), the value (a) in the (Equation 8) is proportional to an inverse number of the amount of primary electron beam signal S0, resulting in that if the beam current is changed from S0 to Sx, it is satisfactory to change the coefficient (a) in the (Equation 8) to a·S0/Sx. The shade level correction can be carried out with hardware when the image detection is performed and it may also be applicable that the value of the detected image measured in advance is subtracted to perform the processing.

Next, there will be indicated the correspondence method when the inspection image is generated, wherein the image detection is performed by the times of n at the same location on the inspected object and their values are averaged. In this case, the noise of the image becomes one for the square root of n. Therefore, in the case of performing the scanning operation by times of n, if the coefficients calculated once through the scanning operation are applied for the operation, it is satisfactory to set each of a, b, c to 1/n, respectively. That is, it is satisfactory that a is set to a/n, b is set to b/n and c is set to c/n, respectively.

Moreover, when the smoothing filter is used for removing noise at the time of inputting image, it is satisfactory to calculate an effect of reducing noise in response to the type of filter and multiply it by the (Equation 8). Because the effect of the noise removal with the input filter can be presumed by the square root of the square sum of the coefficient of the filter, it is satisfactory to determine the threshold in consideration of it.

There has been described the example of the method of acquiring the noise characteristic corresponding to the condition of the image input on the basis of the (Equation 8). As apparent from the (Equation 8), the noise characteristic of the second electron image changes in proportion to the brightness of the detection image. Therefore, also in the case of performing the defect detection, the noise found in the difference image is changed in response to the brightness of the detected image. If the threshold of the defect detection is changed according to the noise characteristic based on the (Equation 8) in proportion to the brightness of each of the pixels applied for comparison work, it is possible to set the threshold corresponding to the inspected object. A more practical setting method for this threshold will be described later.

Next, there will be described the example of means for realizing the function to display the state of the noise changing in proportion to brightness in a visual well-understandable manner.

Figure 6A:
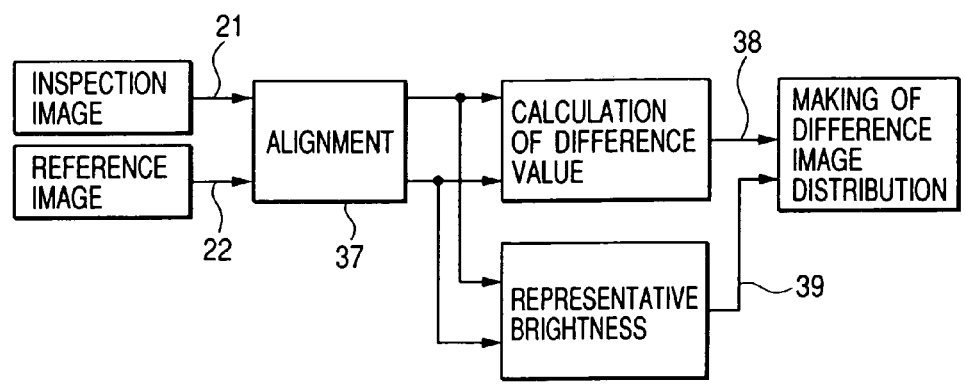
FIG. 6 is a block diagram for showing one example of the difference image distribution making procedure.

There will be considered the case in which the two images placed at the two locations on a certain inspected object are taken and compared with each other in the same manner as that of the example shown in FIG. 3. Since the noise of the difference image is changed in response to the brightness of the images to be used for comparison, it is satisfactory that the brightness of the detected image is plotted on an abscissa and the brightness of difference image is plotted on an ordinate to indicate a relation between these images. The procedure in this case is indicated in FIG. 6a). First of all, the comparing two images are aligned at 37 for their positions so as to reduce influence of stain at the images produced by vibration at the stage and the like.

Figure 7:
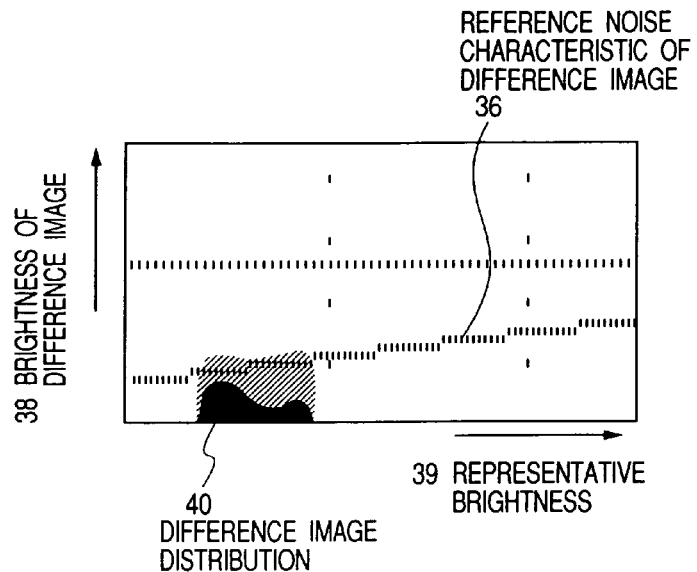
FIG. 7 is a front elevational view for showing a display screen to illustrate one example of the method for displaying the difference image distribution.

Next, difference value 38 between the images after their positional alignment and the representative brightness 39 are calculated for each of the pixels. In this context, the representative brightness 39 is meant by the brightness of an original image, and it is satisfactory that as its value, a mean value of the two pixels to be compared with each other, for example, is applied. Difference image distribution 40 by which the noise characteristic of the image of acquired inspected object can be made when the representative brightness 39 and the brightness 38 of the difference image of each of the pixels calculated in this way are plotted on a graph on the display unit as shown in FIG. 7. In the example of FIG. 7, the density of the plotted point shows frequency in the processed image, and the brightness distribution in the image can be confirmed in visible manner. At this time, it is necessary to note that the defect is not included in the image to be evaluated.

Figure 6B:
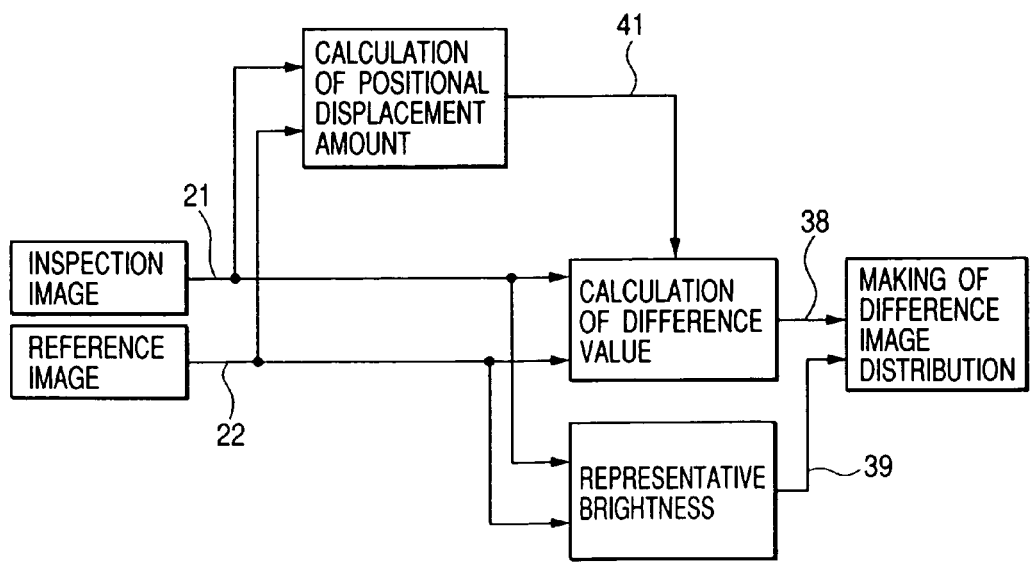

Although the difference is calculated in the example of FIG. 6a) after a positional alignment is done, the amount of positional displacement is calculated for the amount of positional displacement of the pixel or less in each pixel, and similar difference image distribution can be obtained as described in the gazette of Japanese Patent Laid-Open No.Hei 10-318950 even by the method for estimating the brightness change which takes place because of the calculated amount of positional displacement. In this case, it is satisfactory that the brightness change estimated from positional displacement amount 41 is subtracted from the difference value of each pixel. The procedure in this case is illustrated in FIG. 6b).

In the system of FIG. 1, the processing shown in FIG. 6 can be done by the image processing part, although the difference image distribution can also be made by the off-line processing under application of the acquired image on other computers.

As described above, it is possible to acknowledge the state of dispersion in the process by evaluating the non-coincidence between the comparing images or to realize a stable comparing inspection without any nuisance by setting the inspection threshold not generating the non-coincidence.

Next, as to the method for evaluating the dispersion in the process and the method for monitoring the variation in the dispersion of the process in accordance with the present invention, its preferred embodiment will be described as follows.

First of all, the method of evaluating the dispersion of the process will be described in reference to FIG. 8.

A semiconductor wafer specimen sampled from the semiconductor wafers passed through the predetermined processes is observed with the inspection device of the SEM type to acquire the image to be evaluated, and the difference image distribution illustrated in FIG. 7 is made. This result is displayed together with reference noise characteristic of difference image 36 of the (Equation 10) as shown in FIG. 8. Displaying them as shown in FIG. 8 enables a person to understand it easily a ratio of noises of the acquired dispersion images, a component 42 caused by the image detecting system and another component other than this component, i.e. a component 43 caused by the dispersion of the process.

There will be described a method for monitoring the variation in dispersion of process under application of the result of evaluation of the dispersion of the process and managing the process as follows.

Figure 8:
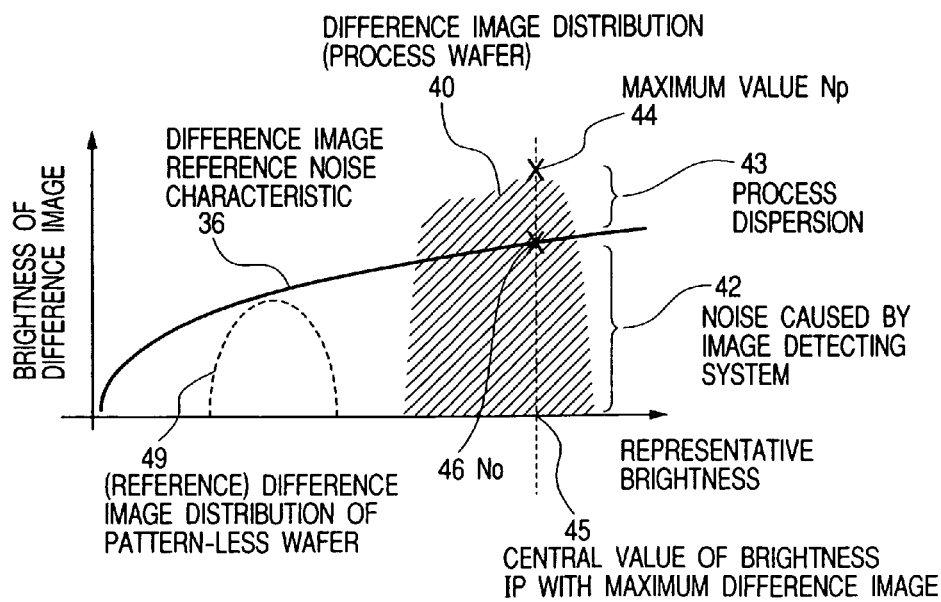
FIG. 8 is a view for showing one example of the method for evaluating a process dispersion.
Figure 9:
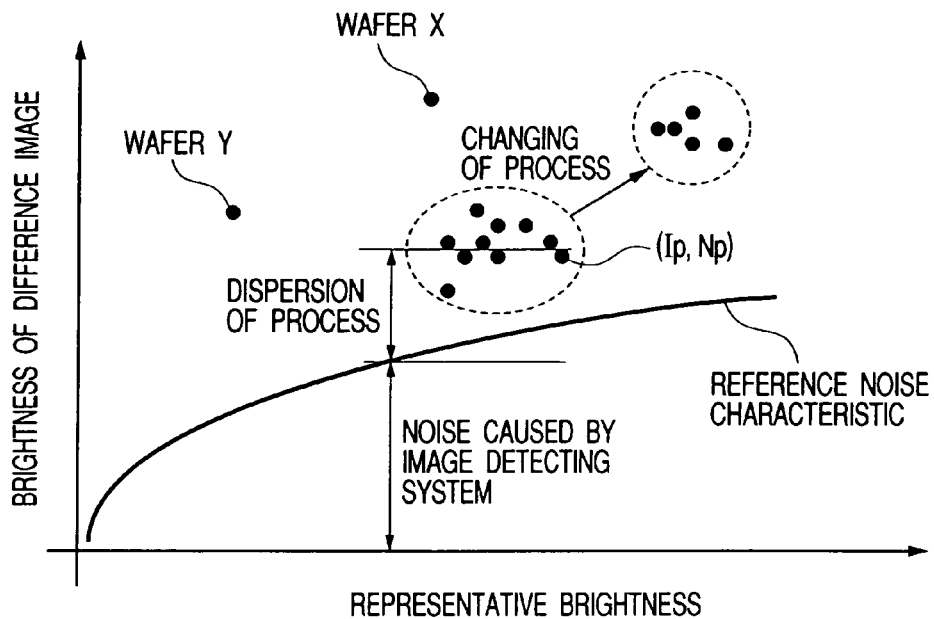
FIG. 9 is a view for showing one example of the method for evaluating a process dispersion.

In the data of FIG. 8 where the dispersion of the process is shown, the acquired maximum value Np44 of the difference image distribution and the brightness representative value Ip45 by which the maximum value is taken are recorded as one set. These data are continuously collected with the wafer of same process/type and being able to monitor the state of these manufacturing processes by plotting and monitoring, and detecting abnormality in the process easily become possible as shown in FIG. 9. By doing appropriate measures to abnormality in this detected process; the dispersion of the quality can be suppressed, a stable production can be assured and a large amount of defective goods can be prevented from being manufactured.

In the example shown in FIG. 9, since the data of the wafer X and the data of wafer Y are apparently away from other data, it can be estimated that certain trouble occurs in the case of manufacturing these wafers. However, since these evaluations are influenced by modification of process (such as a film thickness or a heat treatment, condition of exposure) in addition to variation of the process not yet expected, it is needed to pay a sufficient attention that these states are not determined as abnormal one when the manufacturing process is to be monitored. In the example of FIG. 9, two data groups enclosed with the dotted line show the process change example.

For example, in the case that a sufficient electrical connected state is not attained at a part on the wafer (when a connecting resistance value is high or no connection is made) due to an unstable process in the through-hole forming stage at a location where the upper layer wiring and the lower layer wiring must be electrically connected by a conductor filled in the through-hole originally, a dispersion in brightness at a location where the through-hole is normally formed in the image obtained by a SEM type inspection device is increased and then the difference image is apparently plotted away from other data as found in the wafer X or the wafer Y in FIG. 9.

It is possible to presume it easily from the data of FIG. 9 in this case that a certain cause of producing defect is present at the part in the through-hole. If the location in the through-hole presumed to be this defective cause location is processed by using a Focused Ion Beam device (FIB), and the section is observed, it can be easily determined that the cause of trouble is present in what step for forming the through-hole (etching step) or step for filling the conductor in the formed through-hole (sputtering step or CVD step). Abnormality in the process can be adequately treated by applying a certain countermeasure against the process determined to be a defective cause of the through-hole in response to the result.

For example, if it is determined that the cause of trouble is present in the step for forming the through-hole (etching step), the etching is not sufficiently performed, residual non-etched part is present and an electrical conduction is not sufficiently attained between the upper and lower wiring layers, it is satisfactory to extend a processing time of etching or increase an electrical power for the etching process.

On the other hand, if it is determined that the cause of trouble is present in the step for filling the conductor in the through-hole (sputtering step or a CVD step) and the conductor is not sufficiently filled in the through-hole, it is satisfactory to perform a countermeasure adjustment for the process conditions of the sputtering step or the CVD step (for example, gas pressure, gas flow rate, specimen temperature at the time of forming film and an applied electrical power for either the sputtering electrode or a CVD electrode).

Moreover, in the case that a troubled location can be determined in reference to the image data of the wafer obtained with the inspection device of the SEM type, or in the case that there is provided a data base for collating the image information with the cause of defect, it is not necessary to pass the process of the section observation with FIB device described above and it is possible to feed back directly to the process condition in the manufacturing process under application of the inspection image data.

Thus, monitoring the process where the wafer is processed becomes possible under application of image data obtained by inspecting the wafer with the inspection device of the SEM type.

In the example shown in FIG. 8, the maximum value of the difference image distribution has been applied as the evaluation value. However, a more stable evaluation value can be obtained by applying other statistical amounts such as calculation of standard deviation of the difference image in each of the brightness representative values.

Next, as an example of another method of monitoring the process, a method of expressing these states by one numerical value will be described.

In this example, as shown in FIG. 8, for example, (Np/N0−1) or (Np−N0) etc. having maximum value Np44 of the dispersion and reference noise characteristic of difference image N046 under the brightness are used as an evaluation value of the processing given to each wafer. If the influence of the entire brightness change (like the wafer of FIG. 9) is also monitored, it is satisfactory to monitor the brightness representative value or decide the evaluation value in consideration of this representative brightness as well.

Figure 10:
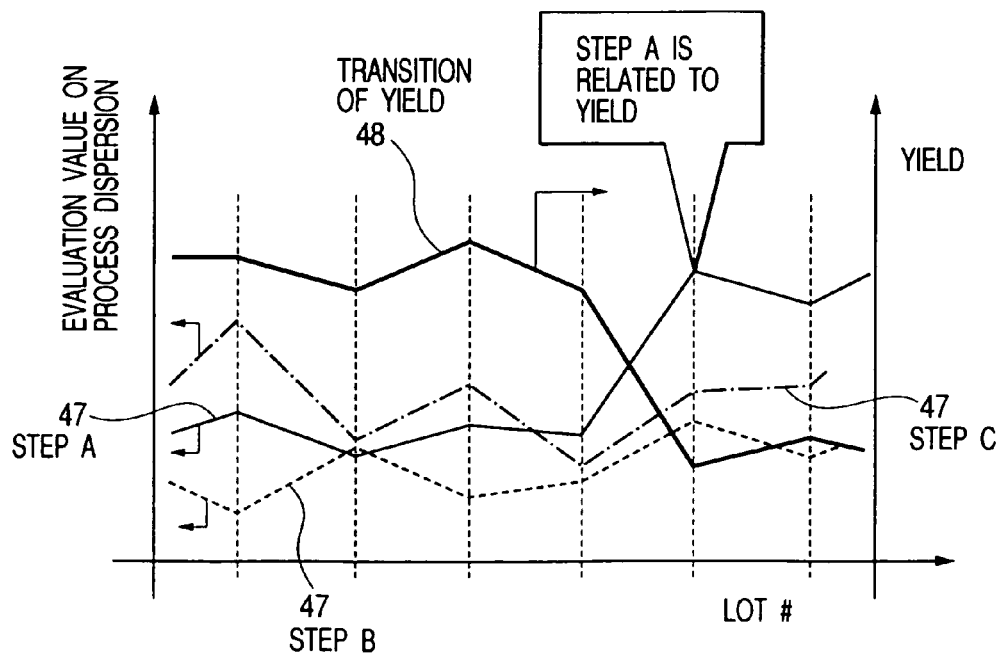
FIG. 10 is a view for showing one example of a method for evaluating a process dispersion.

FIG. 10 shows the example of the monitoring method. Evaluation values 47 defined by (Np/N0−1) or (Np−N0) etc. are collected as an index for evaluating the state of the dispersion of the processing in each process to the wafer as for a certain one type of product. It is possible to acknowledge a time variation in the process, as shown in FIG. 10, by arranging the collected data, i.e. the manufactured wafer or the lot at the abscissa in time-series and plotting the evaluated values.

As shown in FIG. 10, if the data of yield 48 of each lot of the product is monitored together with this, and if there is a process (the process A in the example of FIG. 10) having a high correlation with the change of yield, it becomes an effective means to presume the yield decrease factor, and early measures become possible.

This process will be described more practically in reference to its actual step, wherein a process A in FIG. 10 is assumed to be a through-hole formation process where a through-hole is formed in the inter-layer insulation film and a part of the lower wiring layer is exposed by the etching processing, a process B is assumed to be a process where the conductor film electrically connected with the lower wiring layer in a through-hole by a sputtering or CVD (Chemical Vapor Deposition) and a process C is assumed to be a process where the upper wiring layer electrically connected with the conductor film formed in the through-hole by etching, and the aforesaid evaluation values are arranged in time-series and plotted as shown in FIG. 10 under application of the image photographed by the SEM type inspection device for each of the steps so as to monitor the state of variation at each of the steps.

Monitoring the state of variation at each of the steps in reference to the figure where the evaluation values are plotted, as shown in FIG. 10, for example, assumes that if the step A shows a substantial variation in evaluation value at a substantial similar timing as that of reduction in yield, a certain cause for reducing the yield might be present in the step A for forming the through-hole. Next, a wafer with high yield can be processed in a stable manner by specifying the cause for reducing the yield at the step A and applying a countermeasure against it under application of the aforesaid FIB device or an analyzing device or the like.

Thus, it becomes possible to apply an early countermeasure against the variation in manufacturing process and perform a stable processing of wafer with a high yield at each of the steps by monitoring the data of the dispersion evaluation value with the process or the data of a time change in the process, the data etc. of each lot yield 48 of the product and by monitoring the change of the manufacturing process.

Moreover, with the evaluation image as a data base together with these evaluation values, a presumption whether the cause is a dispersion of shape or a dispersion of resistance value becomes possible by analyzing the image in detail if necessary.

Next, the method of setting the threshold when the comparison inspection shown in FIG. 3 is carried out will be described in reference to the difference image distribution.

As understood from the (Equation 8), the noise of the second electron image increases with the amount of the signal (brightness). Therefore, when the comparison inspection is executed, the threshold of a specified value like the example of FIG. 3 is not applied, but the threshold is changed for each pixel to be processed, and the defect corresponding to the brightness of the pixel is discriminated. Thus, if the threshold corresponding to the noise level of each pixel is set, the performance of the device can be drawn out enough even in the place where the inspection of high sensitivity according to it is possible and a lot of noises exist in the place where the noise is few because the inspection which does not generate the nuisance becomes possible.

Figure 11:
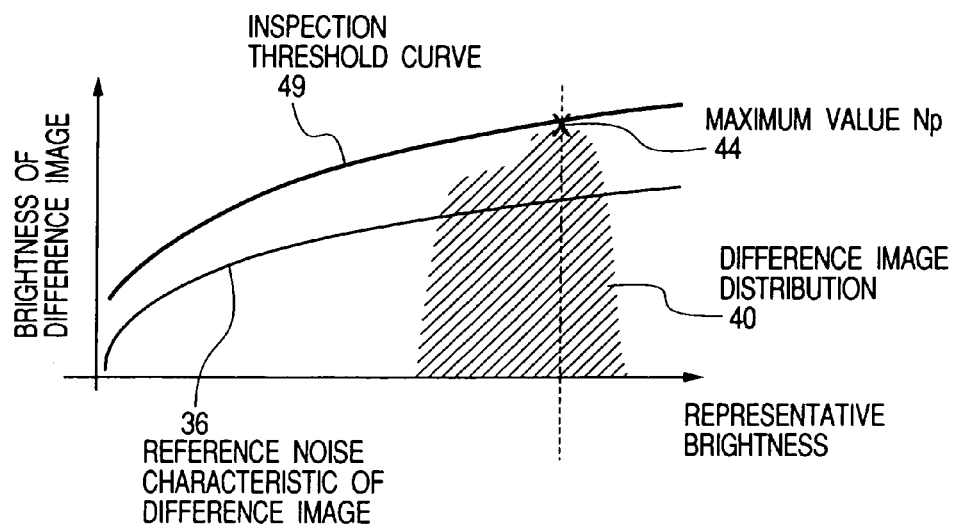
FIG. 11 is a view for showing one example of the method of setting the inspection threshold curve.

If the difference image display shown in FIG. 7 is used, the size of the noise caused in the image of each brightness can be presumed. In order to set the inspection threshold not producing any nuisance, it is satisfactory to set the inspection threshold curve 49 including the acquired difference image distribution at a normal part as shown in FIG. 11. As for this threshold curve, this curve indicates the threshold (allowable value) corresponding to the brightness representative value of the pixel of processed object and the defect at the threshold differing in each pixel is discriminated according to this curve. In an actual inspection device, if this threshold curve is provided as LUT (Look Up Table), high-speed processing can be done.

As clearly apparent from the (Equation 10), the reference noise characteristic of difference image is a monotonous increasing function that takes the square root of the second degree. Setting the threshold by simply using the equation of the first degree becomes possible when the representative brightness is sufficiently bright, or when a range of the representative brightness which each specimen takes is narrow. For example, it is satisfactory that T' is applied as the parameter for the adjustment, and the threshold is (a representative brightness)*T'+CONST.

Thus, a very limit threshold that does not generate the nuisance can be set by setting the threshold under application of the image of an actual inspected object according to the brightness of each pixel.

If this method is used, an appropriate inspection threshold curve 49 can be easily set only by evaluating each type and each process once.

It is preferable that as the image of the normal part used for the evaluation, the images at a plurality of places are used for considering the difference by the place on the wafer. In the example of FIG. 11, although the threshold is set to a very limited difference image distribution, and when amount of images enough for the evaluation is not used, it is satisfactory that it is set to a slight higher value in consideration of the dispersion within and between wafers.

Further, in the case that the positional alignment is not carried out during its comparison inspection and in the case of applying the method, as already disclosed in the gazette of Japanese Patent Laid-Open No.Hei 10-318950, in which a positional displacement amount is calculated in respect to the positional displacement amount less than that of the pixel at each of the pixels and the variation in brightness generated in response to the calculated positional displacement amount, it is satisfactory that the difference image distribution is made by the method shown in FIG. 6b), the threshold is set in the same manner as that shown in FIG. 11, thereafter the defect discriminating value is set under a combination of the allowable value calculated in advance in regard to the positional displacement. As to another method for setting the threshold, it can be adapted by the similar method.

The method of monitoring the state of the device to use the measurement of reference noise characteristic 35 will be described. As described in the examples shown in FIG. 8 and others, it is possible to monitor the dispersion of the process in reference to the amount of an increase of the difference image in respect to difference image reference noise 36, although it is necessary to have a stable dispersion of brightness caused by the image detecting system. However, a change with the lapse of time appears to quality of the second electron image detected by the trouble of the device such as deterioration in an electronic source etc. In the example shown in FIG. 12, the method of always obtaining the reference noise characteristic with high reliability by monitoring the state of this device will be described.

Although it is satisfactory that reference noise characteristic 35 shown in FIG. 5 is measured every day and the change be monitored, it is not necessary to obtain the curved line and it is merely needed to select a proper specimen and perform a regular measurement of both brightness and the dispersion. As the specimen used in this case, specimen having no pattern is applied for measuring the noise caused by the image detecting system.

Figure 12:
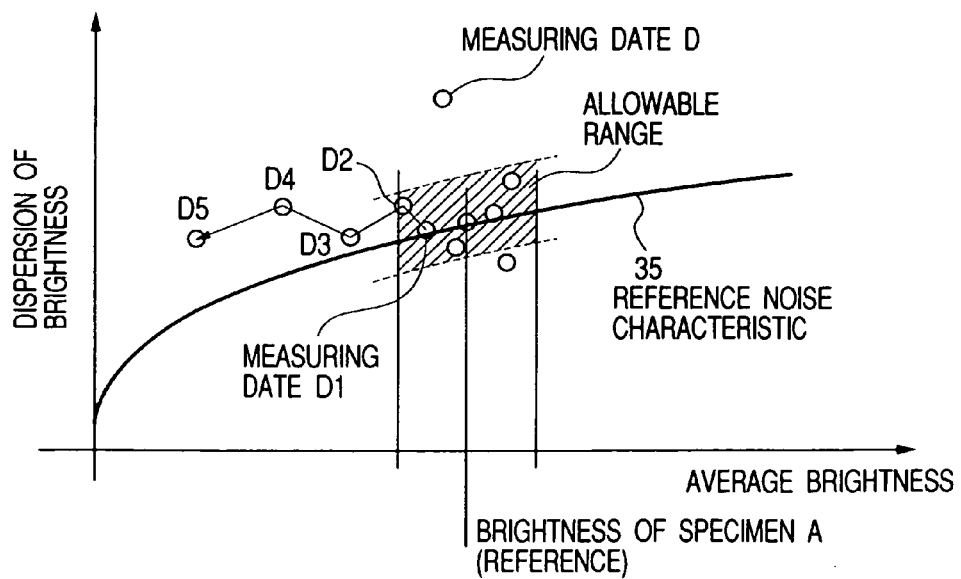
FIG. 12 is a view for showing one example of a method for monitoring an installing state of the electron-beam device of the present invention.

As shown in FIG. 12, if brightness and the dispersion of a certain specimen are measured and they are plotted together with the reference noise characteristic as shown in FIG. 12, the trouble of the device, for example, can be confirmed. If the tendency shown in FIG. 12 is indicated as a result of measurement during the measurement days d1 to d5, for example, the trouble such as the current amount decrease in the primary electron beam etc. is estimated. If the amount of the current of the primary electron beam is recorded concurrently, it is useful for the presumption of the troubled location in the device. Moreover, when noises increase as rapidly as found in days d of the measurement of this figure, the trouble such as increasing of an electric system is estimated.

As shown in FIG. 12, it is usually set such that the allowable range is defined in advance and when abnormality is caused, the device is inspected and its countermeasure is carried out. When an electronic source is exchanged, the reference noise characteristic is measured again because the noise characteristic changes. As the specimen used for the evaluation process in FIG. 12, it is necessary to apply a stable specimen and it is needed to pay a sufficient attention to its deterioration in quality during irradiation of the electron-beam or storage.

Then, there will be described an example of method for setting the threshold to determine the inspection sensitivity in reference to the degree of defect to be detected.

In the inspection device of the SEM type, defective conduction etc. can be detected under utilization of the fact that the brightness of the secondary electron image may express an electrical characteristic of the inspected object in addition to the inspection of the fine pattern or defect under utilization of high resolution of SEM.

Figure 13A:
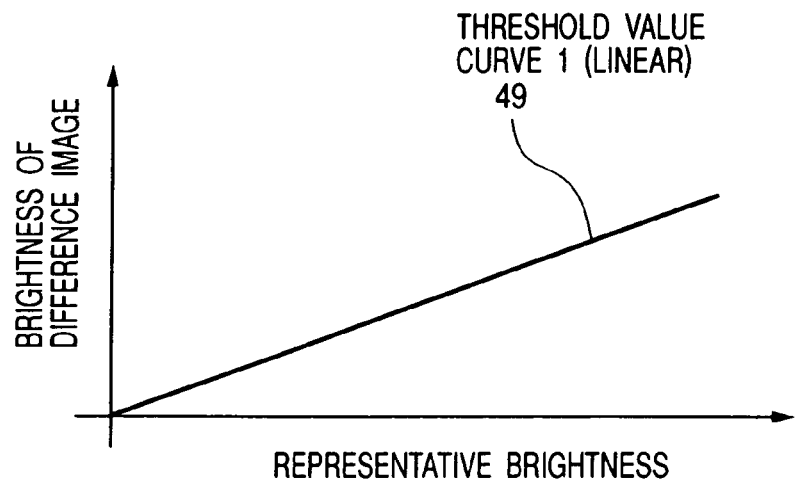
FIG. 13 is a view for showing one example of a method for setting an inspection threshold curve.

If it is assumed that a degree of brightness of the defect is defined in the ratio to the brightness of the normal part, for example, as brightness of the defect part, the defect that wants to be detected and a brightness of the difference image at the normal part become a straight line as shown in FIG. 13a), and so it is required to align the threshold with it. For example, if the part having ±x % or more brightness is detected as a defect for the normal part, (threshold curve)= (representative brightness)*x/100 is satisfactory. This example is an example when there is a size of the defect part enough for detected pixel size, and brightness can surely be detected even if somewhat dispersion in brightness is found, and when the size of the defect that wants to be detected is small, it is necessary that the threshold is set to a small value in consideration of a reduction in detection rate.

Figure 13B:
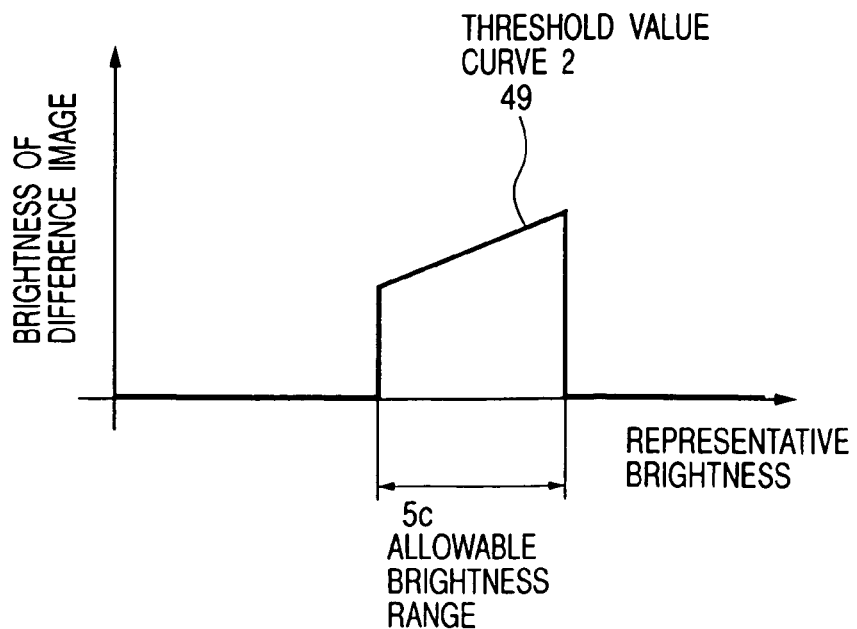

In the case that the allowable range of brightness is given not only with the difference between the comparing images but also with an absolute value, as the representing brightness value, the allowable range of brightness 50 is defined to set the threshold as shown in FIG. 13b). If the threshold is set in this way, the inspection by which the defect is not overlooked becomes possible when a similar defect occurs in the entire wafer and there is no difference in the comparison inspection.

Figure 14:
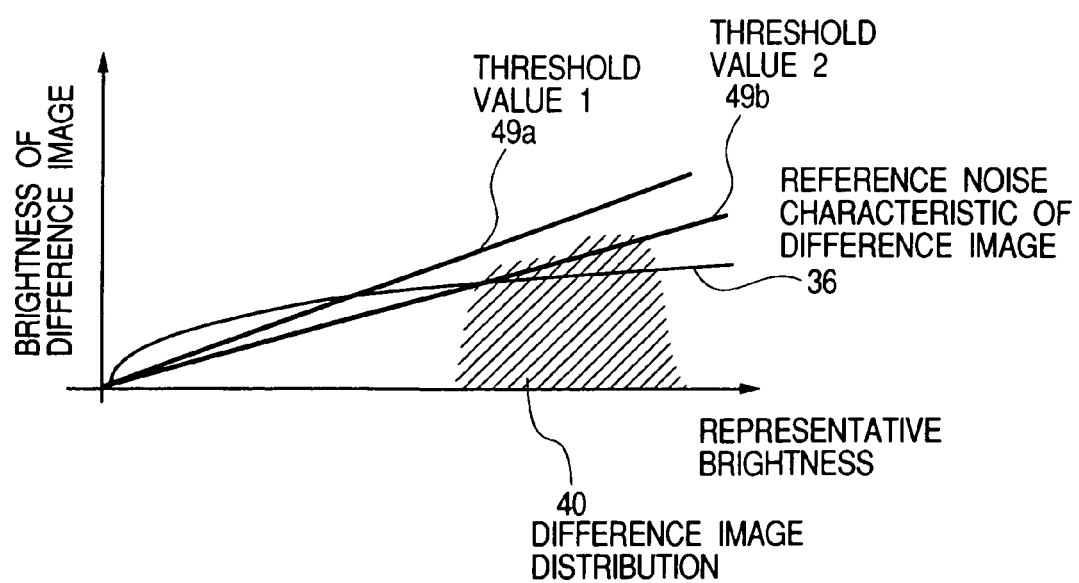
FIG. 14 is a view for showing one example of a method for confirming an inspection threshold.

The relation between the contrast of the defect which wants to be found and the noise can be confirmed by displaying the reference noise characteristic of difference image 36 and the difference image distribution 40 at the normality as shown in FIG. 14 at the sensitivity setting by which such a reference noise characteristic is not considered. For example, it is understood that in the case of the threshold 1 (49*a*) in FIG. 14, inspection without any nuisance can be carried out for the inspected object, although if the shaded portion in brightness is present, it has the lower threshold than that of the reference noise characteristic of difference image, resulting in that the nuisance is outputted. Moreover, it is understood that in the case of threshold 2(49*b*) of FIG. 14, because the threshold to find the desired defect is smaller than the noise in the normal part, and so the inspection without the false information cannot be carried out.

For this case, it is possible to know that a countermeasure for reducing noise caused by the image detecting system is necessary. In an actual inspection system, it is satisfactory that a display as shown in FIG. 14 is performed or warning of the purport is given to the operator where the nuisance is generated in the set threshold.

Moreover, it is possible to provide a countermeasure by setting a plurality of thresholds when the contrast of the defect that wants to be found is different depending on the kind of the defect.

Figure 15A:
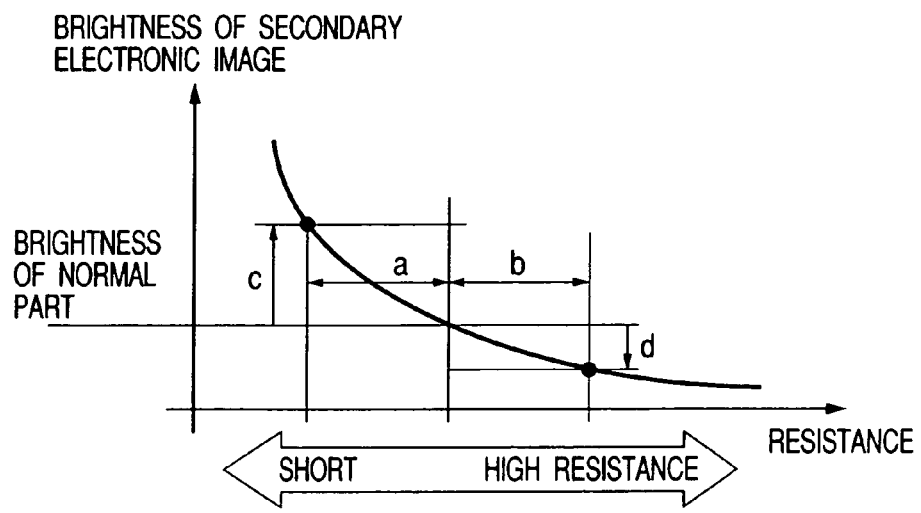
FIG. 15 is a view for showing one example of a method for setting thresholds that are different in response to the type of defect.
Figure 15B:
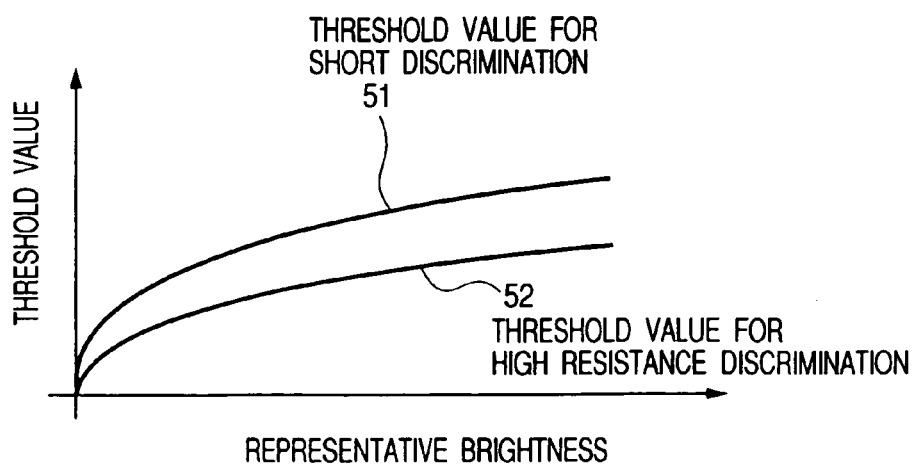

There will be considered about the case with the relation shown in FIG. 15*a*) being present between resistance of the pattern of the inspected object and the brightness of second electron image (the relation between this resistance and brightness changes by the condition of an electronic optics system or the structure of the inspected object). Because the change rate of brightness to the resistance change is not fixed in the example of FIG. 15*a*), even if the defect having the same different resistance value as that of the normal part is checked, the difference image with those of normal parts does not become the same brightness. In the example of FIG. 15*a*), although the differences a, b are equal to each other, a difference in brightness is c>d, i.e. the high resistance defect has a smaller change in brightness, so that its detection is difficult. Thus, as shown in FIG. 15*b*), it is satisfactory that the two defect discriminating values are applied to perform a determination of the bright defect (short in FIG. 15) with the high threshold 51 and a determination of the dark defect (a high resistance in FIG. 15) with the severe threshold 52.

Referring to FIG. 16, a practical example of realizing method will be described. If the sign of the difference image is seen, it is possible to know whether the defect part is brighter than the normal part or darker.

Figure 16A:
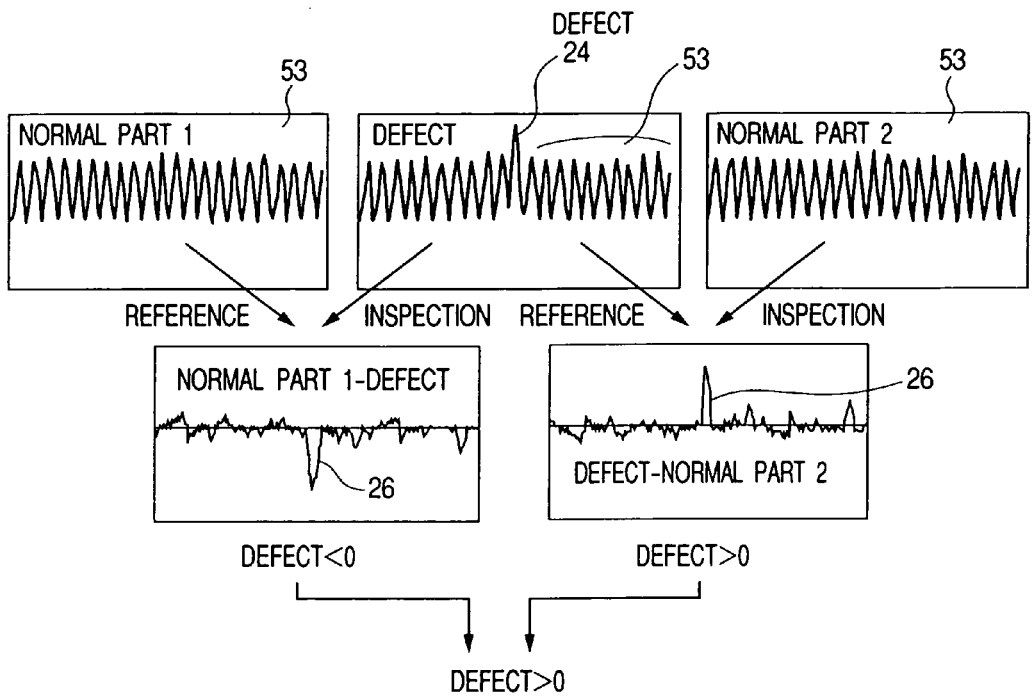
FIG. 16 is a view for showing one example of a method for setting thresholds that are different in response to the type of defect.

In the case that the comparing inspection shown in FIG. 3 is performed in sequence at an area on the inspected object, the brightness of difference image at defect 26 can be obtained when the inspection image 21 is a defect and when the reference image 22 is a defect. As shown in FIG. 16*a*), when defect 24 is brighter than normal part 53, (reference image-inspection image) becomes negative if the inspection image has a defect and when the reference image has a defect, its code becomes reverse.

It is understood that a combination of these two defect detection results causes a position of the defect to be placed on the inspection image where a first defect is detected and causes it to become apparent that its brightness is brighter than that of the normal part.

Figure 16B:
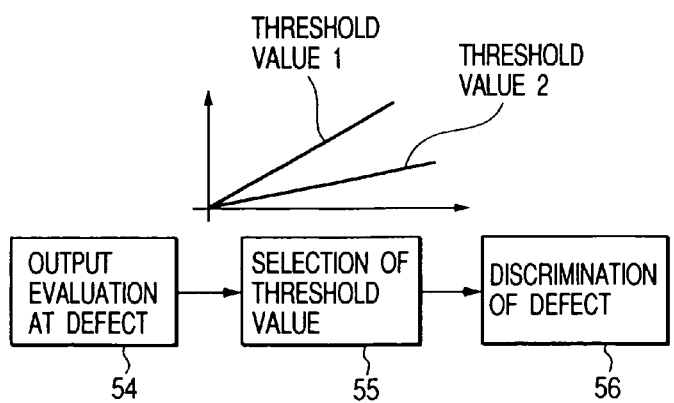

In the case that the defect is darker than the normal part, a combination of the codes becomes reverse, so that it can be discriminated whether the defect is either the short in FIG. 15 or the high resistance. As shown in FIG. 16*b*), in the case that inspection is performed under application of two thresholds 1, 2, the defect is detected at first with the more severe threshold 2, each of the codes of the defects is confirmed to perform evaluation at 54 for the brightness of difference image at defect, select at 55 either the threshold 1 or the threshold 2 and the defect determination 56 is performed.

Also in the case that the type of defect can be discriminated in reference to the features other than "bright/shade", it is possible to perform the setting of threshold corresponding to each of the defects.

Brightness of the secondary electron image is determined in reference to a secondary emission ratio of the specimen. In addition, it is necessary to correspond to a wide, dynamic range in the device that inspects it under the condition of various kinds of inspected objects and electronic optics systems because the secondary emission ratio also changes by the irradiation energy of the primary electron beam.

There will be described a preferred embodiment for a threshold setting function corresponding to an image of such a high dynamic range.

Figure 17A:
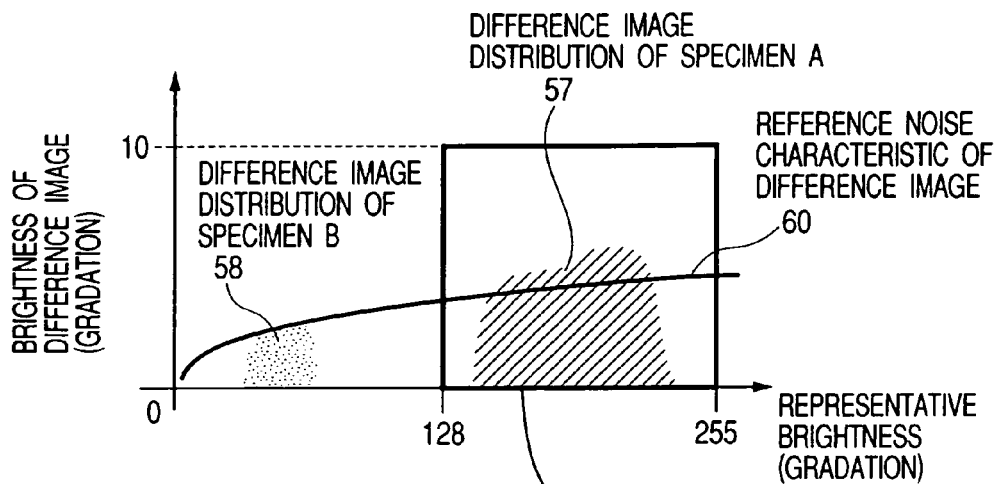
FIG. 17 is a view for showing one example of a problem of the brightness conversion and the countermeasure against the problem.

It is assumed that, the distribution of the difference image of specimens A and B is set as shown in FIG. 17*a*) (57,58), when the entire dynamic range of the detector is assumed to be an image in eight bits. When their images are used as they are and the specimen A is inspected, only half among 8 bits and 256 brightness are used. Because the value of the difference image becomes small in a minute defect, the influence of the quantization noise becomes a problem. Therefore, the inspection in such a state is not preferable.

Figure 17B:
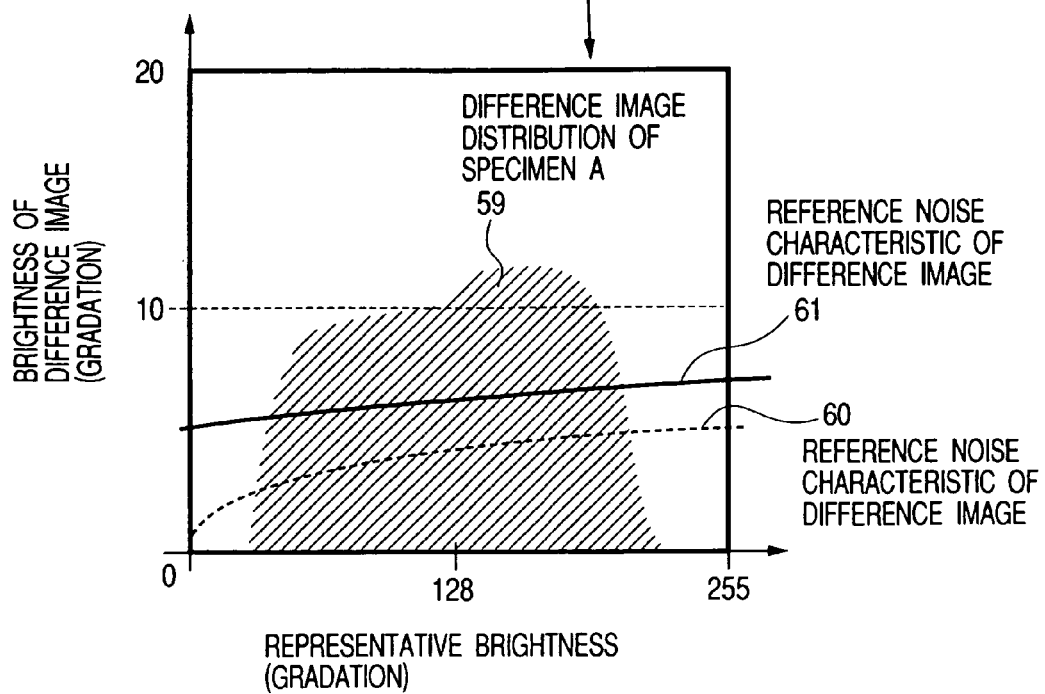
Figure 18:
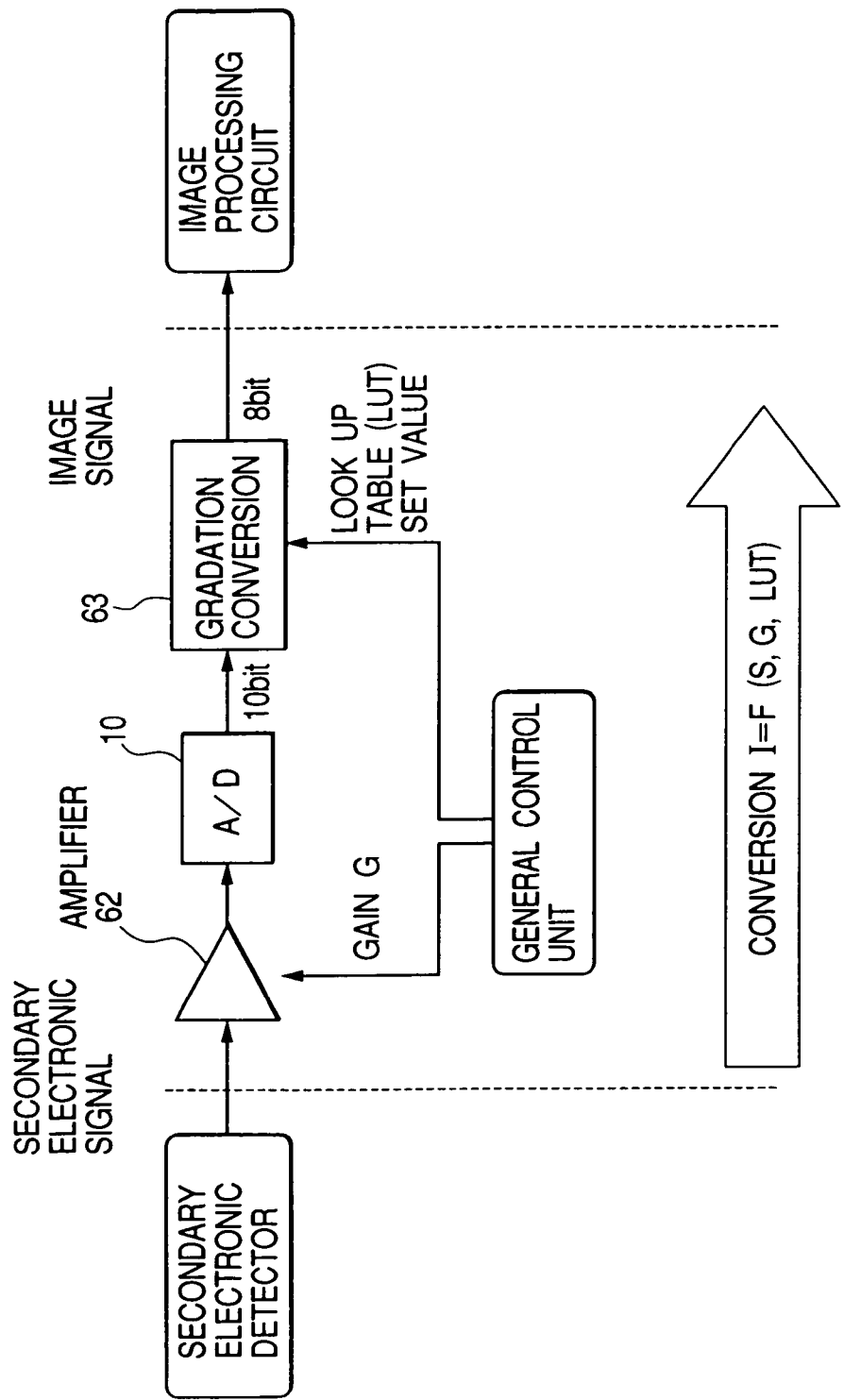
FIG. 18 is a block diagram for showing a schematic constitution of the brightness conversion.

Then, if the brightness is converted so that the signal in the rectangle of FIG. 17*a*) may become eight bits of the detected image as shown in FIG. 17*b*), the inspection of the quantization or more noise by the small size becomes possible. This brightness conversion puts once by more numbers of brightness than that of the processing image as a digital image, processes a suitable part, and only has to change the amplification rate of amplifier 62 used when the second electronic signal is detected as shown in FIG. 18, and process of doing brightness conversion 63 to the processing brightness is carried out. It is satisfactory that these adjustments acquire, evaluate the inspected pattern image in advance, and an appropriate value only has to be set. For example, when specimen B of FIG. 17*a*) is inspected, it is satisfactory to perform a conversion according to the brightness of specimen B.

However, because the brightness of the detected image changes depending on the content of the conversion when these are converted, the amount of an actual second electronic signal which arrived at the detector is not correctly shown.

In one of the troubles of such brightness conversion, there is a problem of the threshold setting. There will be described the example of this trouble and its countermeasure method.

For example, it is assumed that the reference noise characteristic of difference image shown in FIG. 5 is measured under the image input condition of FIG. 17*a*). Then, if the brightness conversion shown in FIG. 17*b*) is carried out, the relation between the detected secondary electronic signal and the brightness value of the image is changed, so that the reference noise characteristic of difference image 60 measured under the condition shown in FIG. 17*a*) cannot be used as an index with difference image distribution 59 after the brightness of specimen A is converted. It can be said that a similar situation is applied to the inspected threshold indicated in FIG. 11 or FIG. 14 and the like. As understood from this example, when the image input condition is changed as shown in the reference noise characteristic 61 of FIG. 17*b*), either the reference noise characteristic of difference image or the threshold curve needs conversion.

In addition, when the image input condition is changed according to the evaluated specimen, images with different input conditions are compared, and the difference etc. of the amount of the signal are evaluated, and conversion like the above-mentioned is needed.

Thus, when the best image input condition corresponding to the specimen is set, it requires a function to convert the acquired image into the image when the obtained image is taken under the same image input condition.

To achieve this conversion function, it is satisfactory that the computer only has to be able to do conversion from the secondary electronic signal shown in FIG. 18 to the image signal.

Actually, these conversions only have to be able to do conversion or the inversion to the image of other input conditions on the basis of not the secondary electronic amount and the image brightness but on the basis of the image in a certain input condition.

The conversion of an amplifier 62 and an analog to digital converter 10 can be shown by the equation of first degree, and the function of conversion is easily acquired. As to the brightness conversion 63, it is possible to perform a countermeasure by using LUT of the inversion though it is possible to perform a countermeasure by using a nonlinear conversion that uses LUT.

Figure 19:
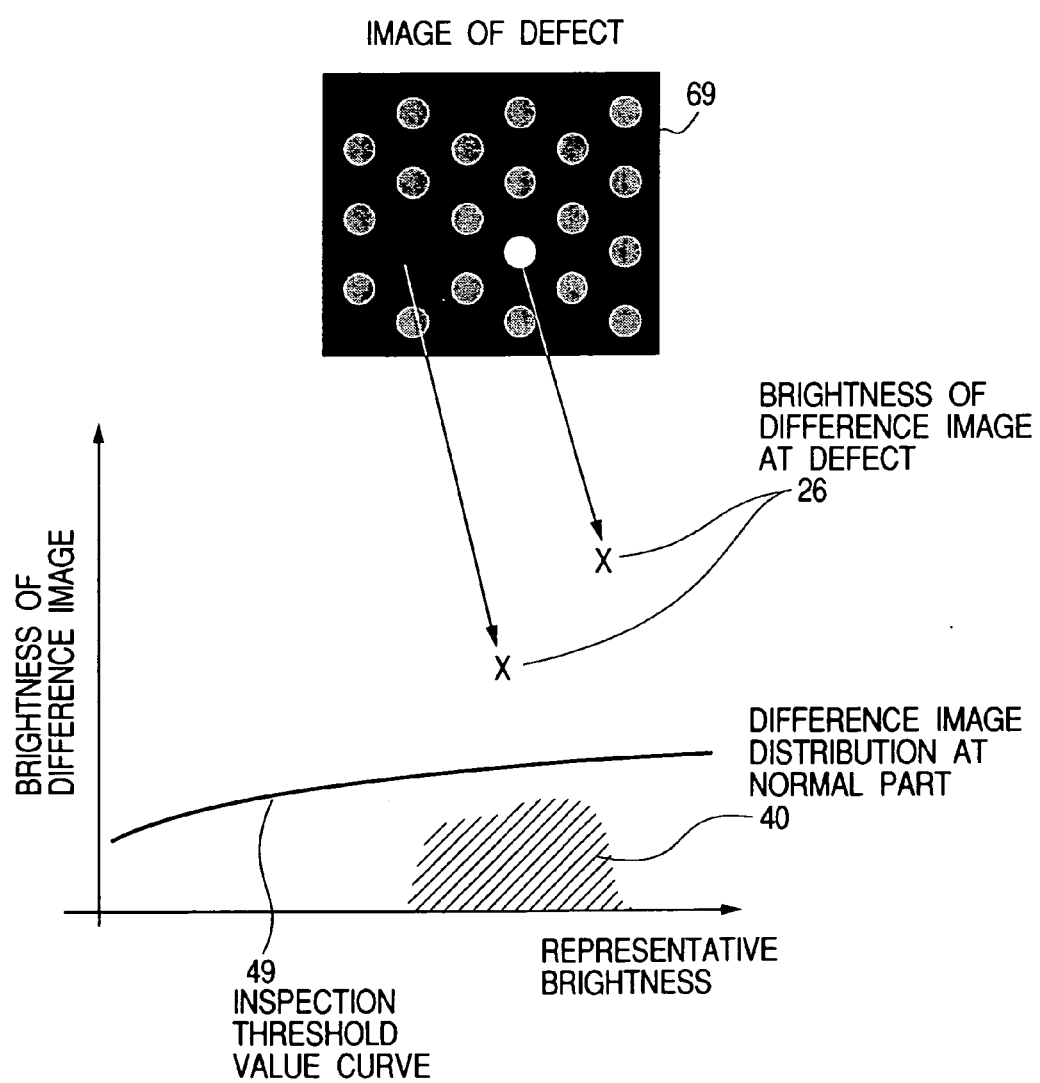
FIG. 19 is a view for illustrating one example of the method for displaying the brightness of difference image at defect.

Although the evaluation method with a current process dispersion or the threshold setting method was a method for evaluating the noise characteristic of the difference image under application of image at the normal part, arrangement of the function to display the degree of brightness of difference image at defect when the defect is detected enables the degree of the defect to be informed to the operator. For example, as shown in FIG. 19, if brightness of difference image at defect 26 that is the absolute value of the difference image brightness of the defect part is displayed with inspection threshold curve 49 or with normal part difference image distribution 40, it is possible to know how the detected defect has been detected in what degree of surplus amount. In this case, the level of the brightness of difference image at defect is a level of the difference to the compared normal part brightness, and it is satisfactory if it is evaluated by using the maximum value and the mean value etc. of brightness of difference image at defect 26 (difference image), for example.

Figure 20:
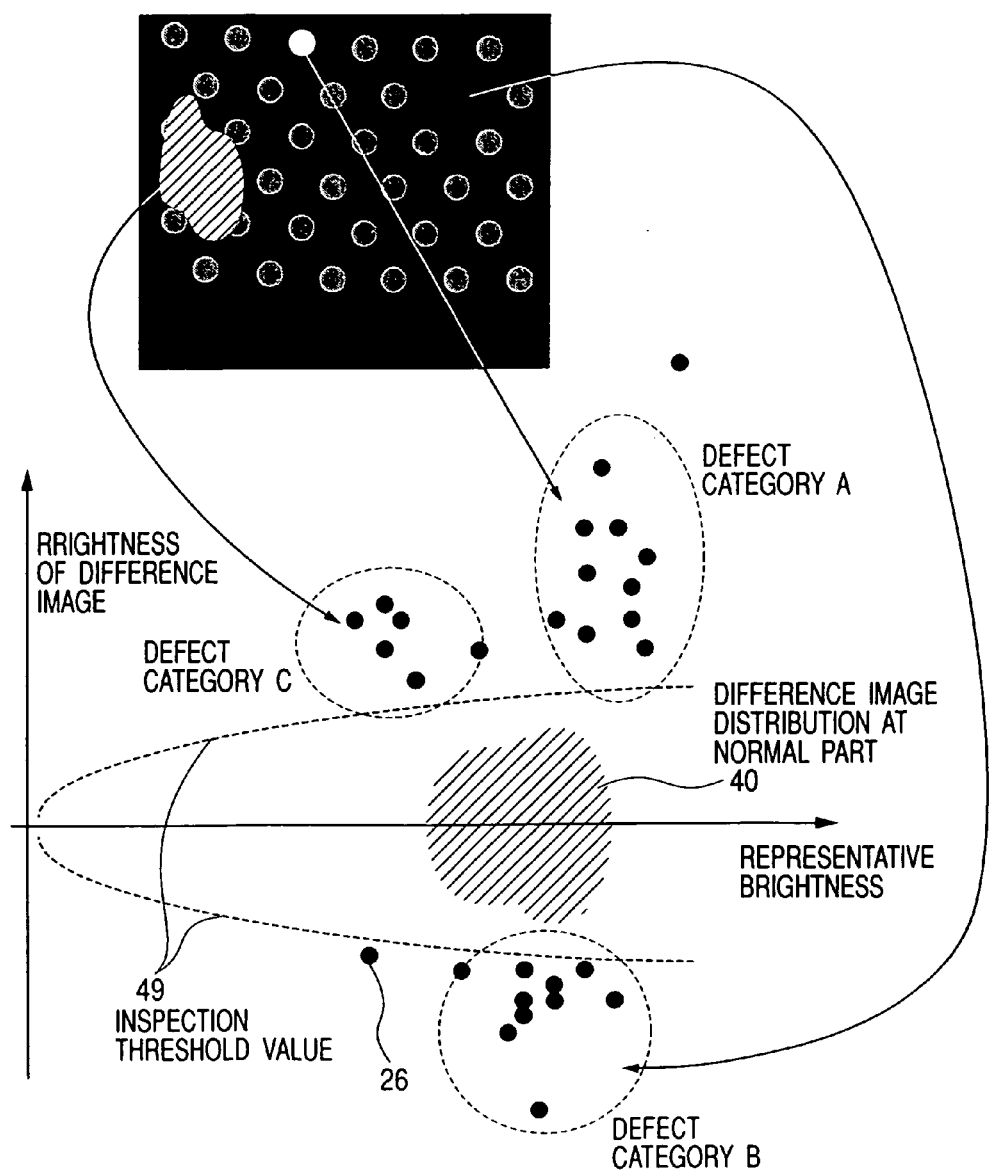
FIG. 20 is a view for showing one example of the display of the brightness of difference image at defect and the classification method.

Moreover, as to all the detected defects, if the data on the brightness and the brightness of difference image at defect 26 are plotted for respective brightness and the brightness of the difference image as shown in FIG. 20, there sometimes occurs that the type of defects can be classified in reference to the distribution. In the example of FIG. 20, the difference image brightness is not the absolute value but, if it is discriminated that the defect is brighter than that of the normal part under the processing shown in FIG. 16, it is shown in a positive value, and in turn if it is discriminated dark, it is shown in a negative value. If this distribution is acquired once, it is possible to classify the acquired defects into what type of defects when the wafer in the same kind and same process is inspected.

Although information on brightness of the defect and the difference image brightness can be obtained by evaluating the image of the defect part at the same time as the defect detection and processing, it can also be acquired by getting and evaluating the image of the defect again after inspection. Acquiring information during inspection is short in its processing time. It is also possible to classify them by using other information in the defect part image like the texture and the differentiation value, etc. besides the value of brightness and the difference image shown in FIG. 19 and FIG. 20.

Figure 21:
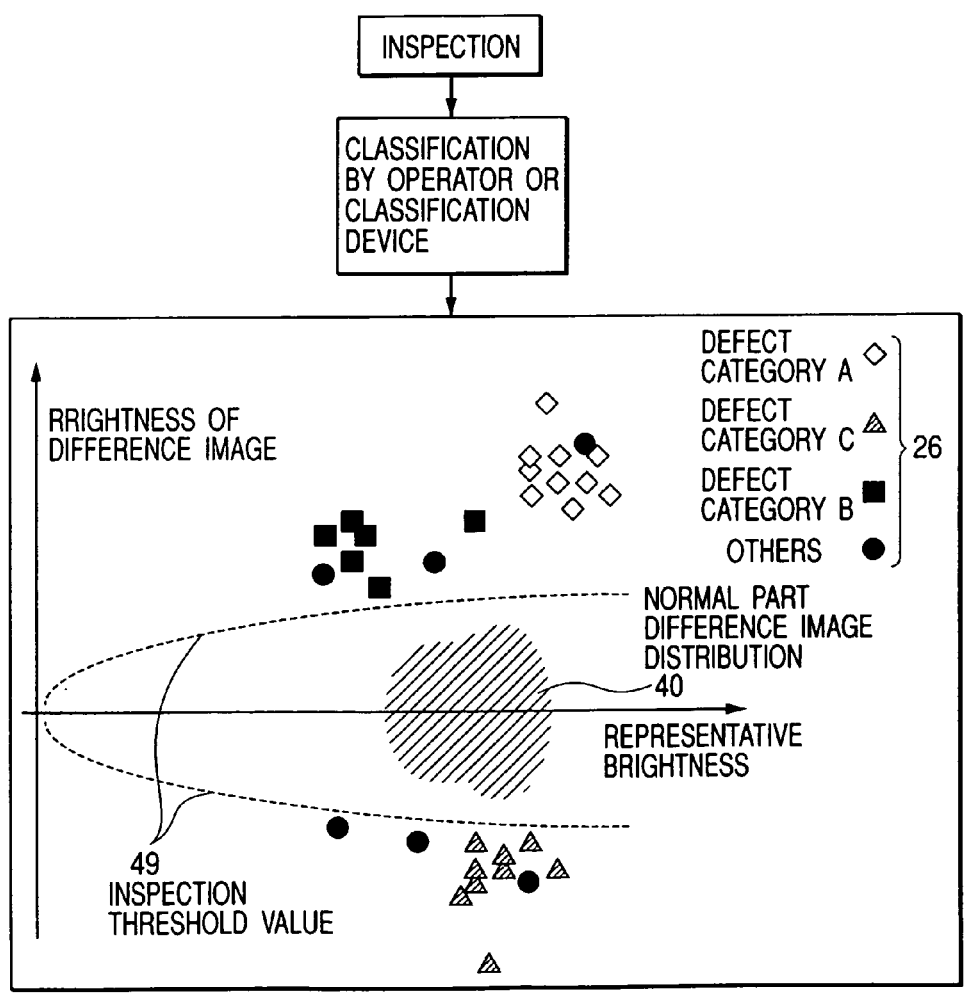
FIG. 21 is a view for showing one example of the display of the brightness of difference image at defect and the classification method.

Moreover, as shown in FIG. 21 contrary to FIG. 20, it is possible to know the brightness of each defect and the difference image distribution by adding information classified with an operator and a defect classification device. If an operator classifies the data once as well as the example of FIG. 19, it becomes possible to classify the inspection result afterwards in an easy manner.

Through these distributions, it is possible to know in what degree of surplus amount the defect is detected against the threshold and further it becomes possible to presume in what degree the defect not detected with a surplus amount is present.

Moreover, even if it is the same kind of defect when the cause of the detected defect is analyzed by the section observation etc., using the defect part where the level or more is severe is not few for it to become easy to analyze. Therefore, if there is provided the function to select the one having severe extent, it is quite useful for the cause investigation.

Figure 22:
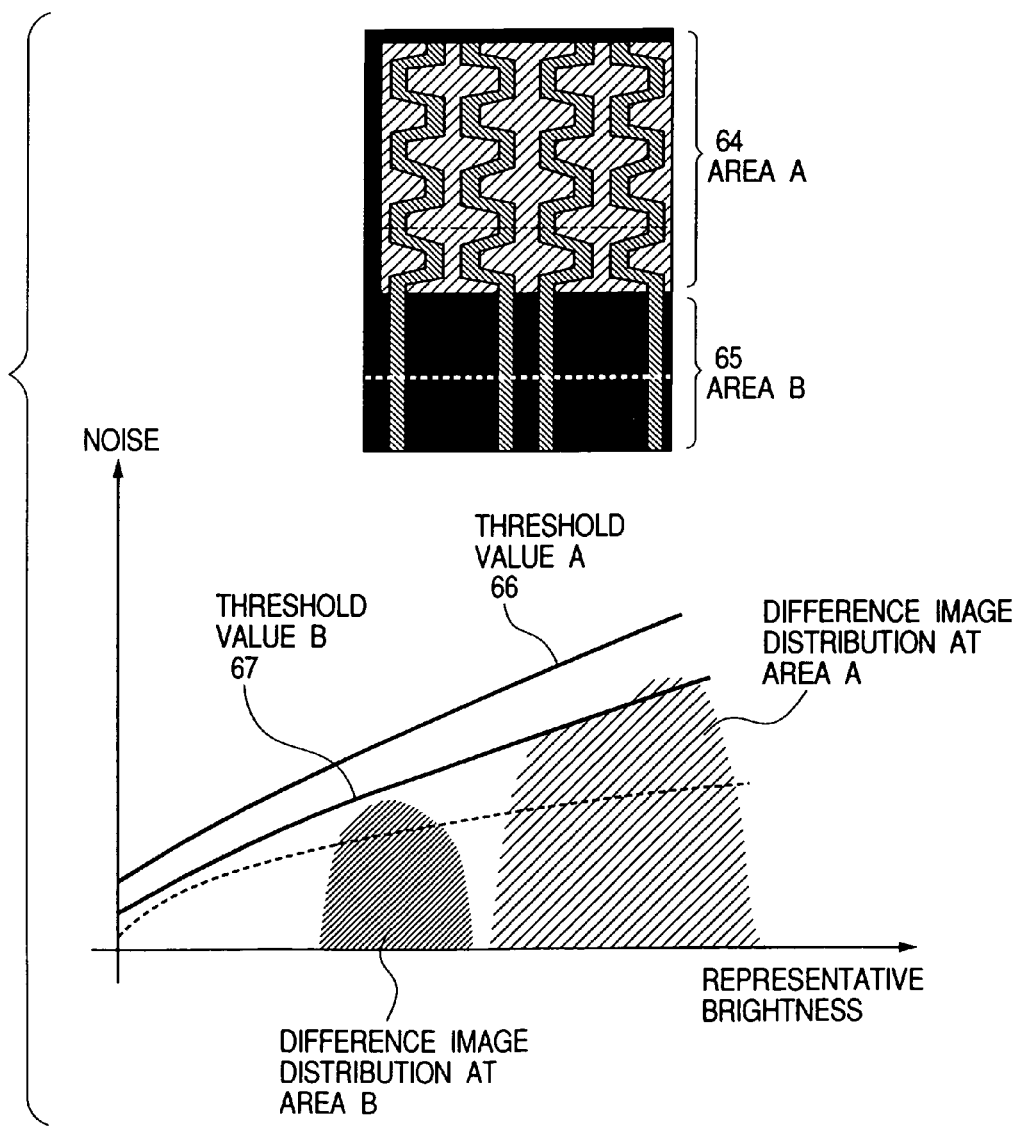
FIG. 22 is a view for showing one example of the method for setting sensitivity that is different in every area of the inspected object.

As shown in FIG. 22, the inspected object has an area where shape and the density of the pattern are different according to the place. For example, in case of the semiconductor wafer shown in FIG. 2, they are memory mat 20c with comparatively high pattern density and the peripheral circuit 20b with sparse pattern. When the size with the process dispersion is different according to the pattern of such an inspected object, the inspection sensitivity is changed in response to the inspection area, thereby the inspection can be realized at a higher sensitivity.

For example, as shown in FIG. 22, if it is divided into area A(64) and area B(65) by the pattern on the wafer and each normal part difference image distribution is evaluated, it is possible to know the size of the dispersion of the process in each area. It is satisfactory that the inspection is carried out after determining the threshold A(66) and B(67) of each area based on these difference image distribution.

The area division on the wafer is actually performed by the method for acquiring the image and dividing it with a texture analysis, setting by an operator and means for using design information for the wafer or the like. In this case, if necessary, it is satisfactory to utilize means such as optical microscopes of low magnification and with wide view.

Figure 23:
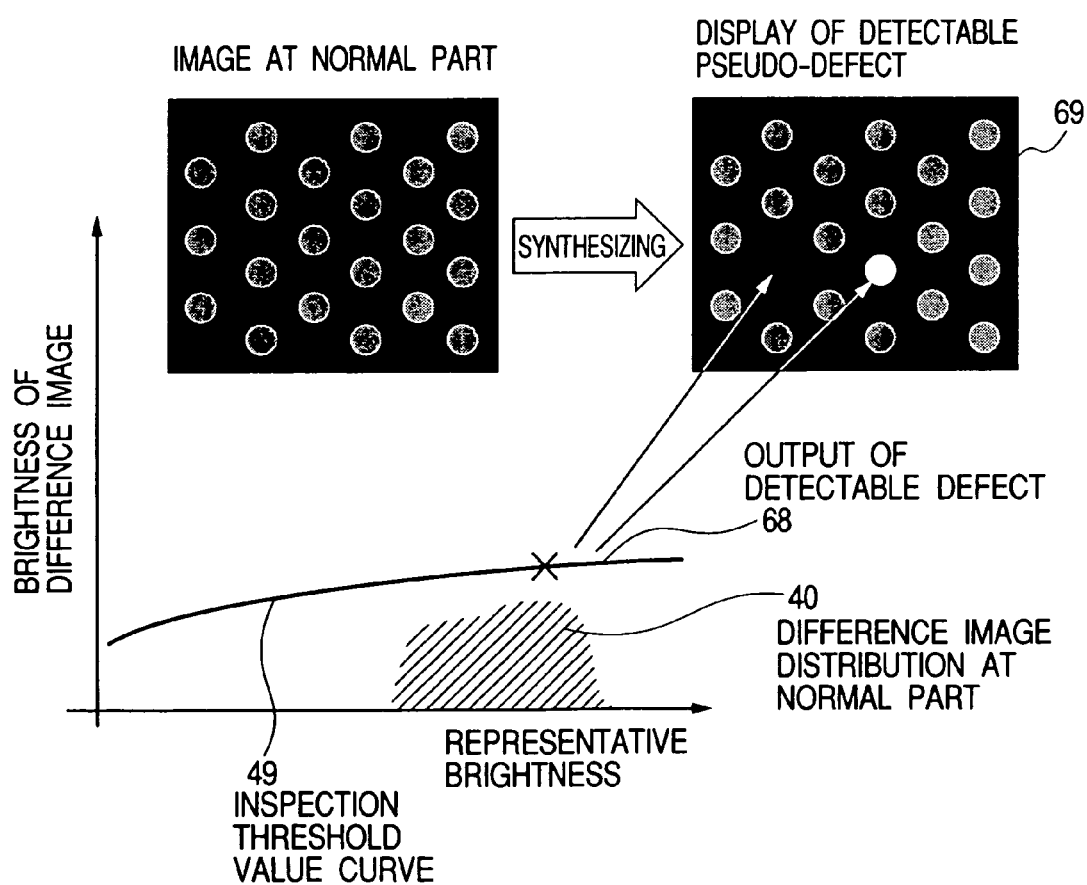
FIG. 23 is a view for showing one example of a method for confirming an inspection threshold.

Referring to FIG. 23, the function to confirm the defect that can be detected by the set threshold in a visible manner when inspecting will be described.

There will be considered an example when a conduction inspection of the hole pattern shown in FIG. 23 is inspected.

When the inspection threshold curve 49 is set, an brightness of difference image at defect 68 which can be detected is decided, so that they are synthesized on the evaluation image to check how they are seen as the actual image of the inspected object and they can be displayed as synthetic image 69. Thus, the operator comes to be able to confirm the inspection sensitivity that the operator set in a visible manner by pseudo-displaying the detected defect.

In the case of inspection of the semiconductor wafer, a defective cause might be able to be presumed by analyzing the defect distribution.

For example, it might be useful for the presumption of a defective cause by risk, and through seeing the defect generation distribution in the areas including distribution in the wafer, in the shot, in the chip, and in the cell area.

Figure 24:
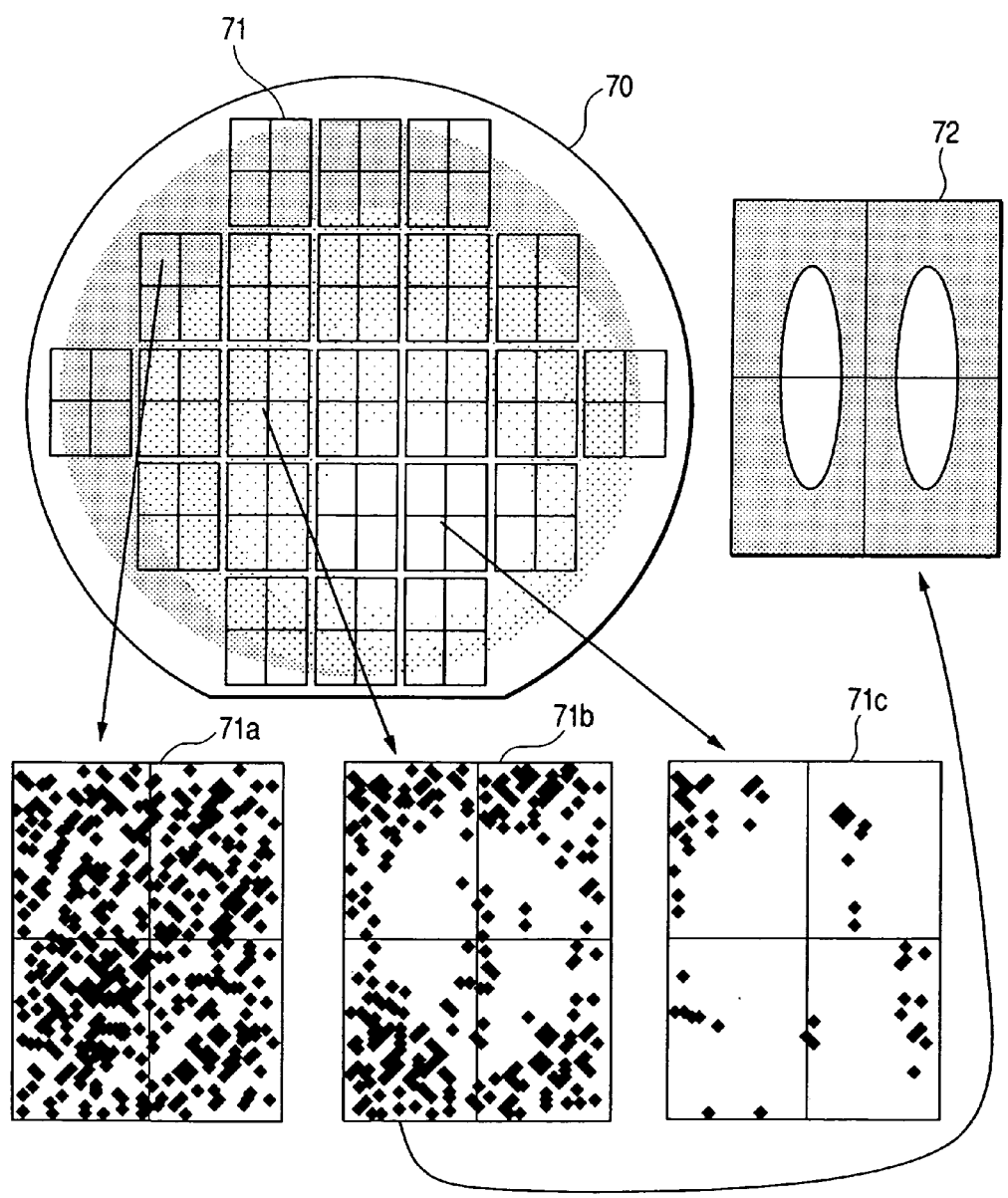
FIG. 24 is a top plan view of the wafer that illustrates the problem of setting the inspection threshold.

It is assumed that the distribution of the defect density was generated in wafer 70 as shown in FIG. 24 as a result of inspection with a certain inspection threshold (in FIG. 24, the part where the color is thick shows the part where the defect density is high). Some defect distribution 72 might be able to be confirmed for this case by seeing the defect distribution in each shot 71 for example also in the shot as shown in shot 71b of FIG. 24. However, there occurs the case where the tendency in other shots cannot be confirmed due to the fact that a defect density in the shot 71a is too high and the number of detected defects in the shot 71c is too less. For this case, there is a possibility that similar distribution can be confirmed by adjusting sensitivity at each shot, and executing the inspection again.

However, time required for performing inspection at the SEM type inspection device is long and when the location once inspected is inspected again, an inspection under the same degree of sensitivity as that of the previous inspection might not be carried out unless the electrical charged state at the wafer surface is discharged as countermeasure, so that it is hard to perform the re-inspection work.

Figure 25:
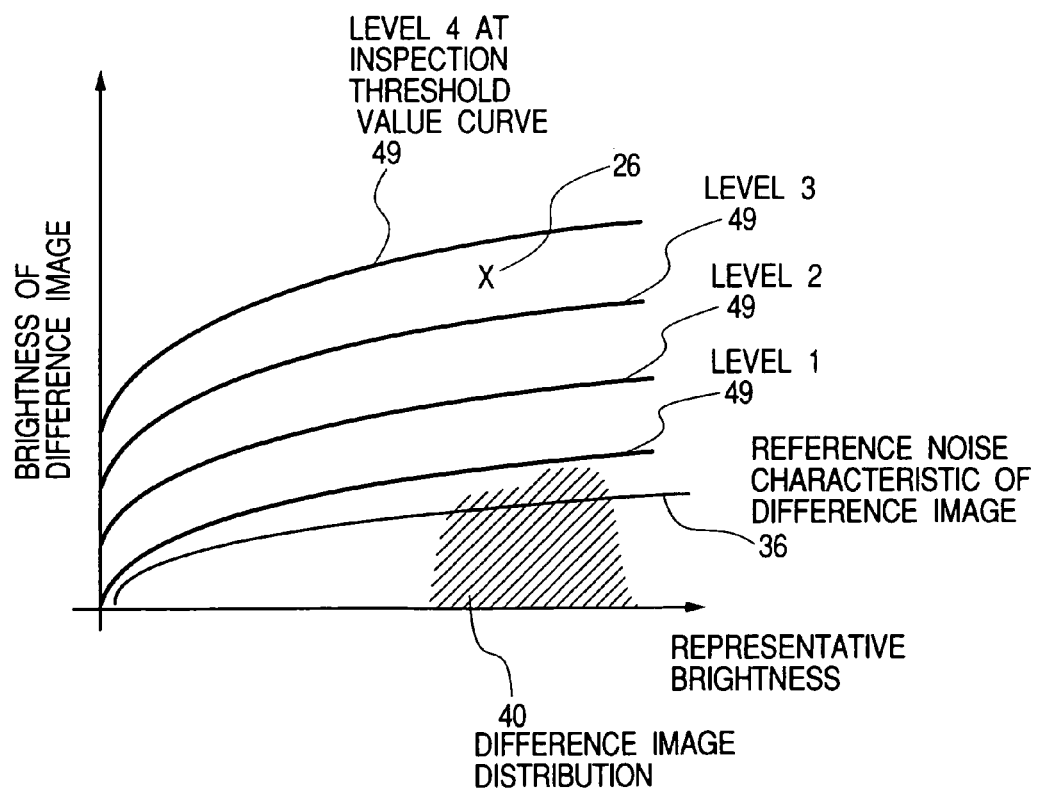
FIG. 25 is a view for illustrating one example of a method of inspection using a plurality of two thresholds.

Then, there will be described a method by which such defect distribution as above can be ensured by setting a plurality of sensitivities at the time of starting the inspection work and carrying out the inspection. As shown in FIG. 25, this inspection work is carried out under application of a plurality of threshold curves. The defect detection is carried out with the most severe threshold (level 1 in FIG. 25), the maximum threshold from which each of the defects can be detected is applied as the defect level in reference to brightness of the difference image, it is added to the defect information and then this is outputted as a result of inspection. For example, the level 3 of the defect shown in the figure in the example of FIG. 25 is 3.

Figure 26:
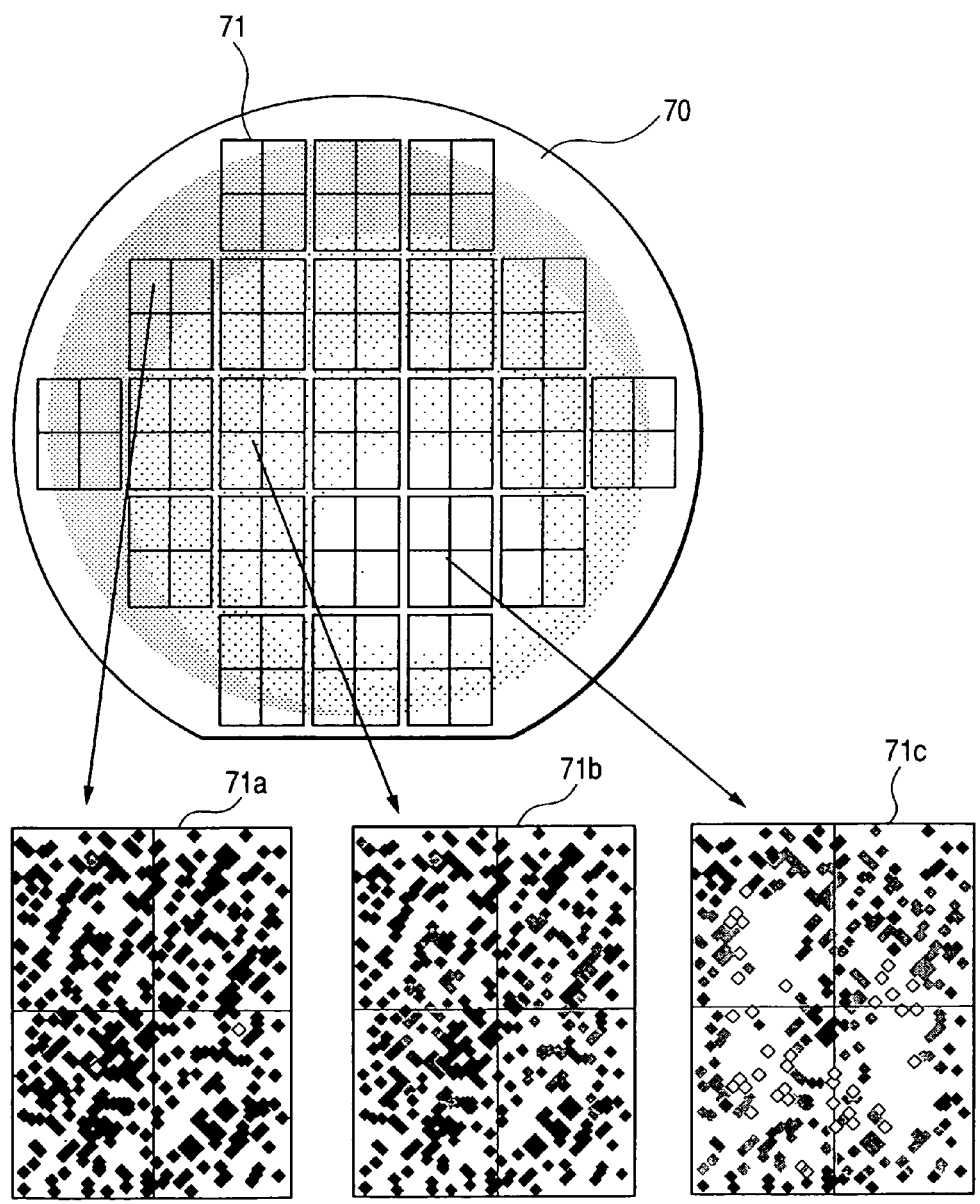
FIG. 26 is a top plan view for showing one example of a wafer to illustrate the effect of inspection using a plurality of thresholds.

In FIG. 26, the defect detected under the condition shown in FIG. 25 is displayed by a color different in each defect level, and a defect distribution 72 confirmed at 71b in FIG. 24 can be confirmed even by shots 71a and 71b. Besides this, it is possible to know the defect distribution not found in FIG. 24 by selecting only the one at the specified defect level and by displaying it. Moreover, the present invention has an advantage that, if a defect happens frequently, not only the distribution of the defect position but also its extent can be obtained concurrently. In addition, if information indicating whether the defect is bright or dark as compared with the normal part is added in the same manner as that shown in the example of FIG. 16, defect state can be recognized more in detail.

A similar effect can be achieved by adding information about brightness of each defect to the inspection result. This can be achieved by adding the information of brightness of difference image at defect to defect information about the position and the size, etc. of it after the defect is detected. A result which is similar to that shown in FIG. 25 can be attained after inspection by displaying a defect map through filtering the result of inspection or expressing information about brightness with dark or bright level values. Further, in this case, the present invention provides an advantage that it is possible to know the inspection result in an arbitrary threshold after confirmation of the result of inspection which is different from the example of FIG. 25.

Thus, a defect distribution can be adequately acknowledged by combining inspection results under a plurality of sensitivities, and the effect of shortening a period of cause investigation and its countermeasures is achieved. In addition, there will be described a method for evaluating a machine difference among a plurality of SEM type inspection devices by applying using the function for evaluating a difference image in accordance with the present invention.

According to the present invention, the noise characteristic of the SEM type inspection device can be acknowledged, a setting of the inspection sensitivity can be performed in response to the noise characteristic and the change of the manufacturing process can be evaluated. However, in the case that a plurality of SEM type inspection devices are used, it is necessary to recognize not only a characteristic of each of the devices, but also a difference in performances between the devices as well.

Even the same specimen is applied, a brightness of its image detected by the inspection device differs in response to a characteristic of a detector or an amplifier and the like. Therefore, even if a reference noise characteristic of each device is measured, it is difficult to know the relation between devices correctly as it is. Then, it is satisfactory that the noise characteristic of each of these devices is normalized under application of a reference value. As a reference value for normalization, it is satisfactory to normalize it by applying a specimen of stable material quality for the electron-beam irradiation on the basis of brightness of the secondary electron image detected with each inspection device. As a stable specimen, for example, it is satisfactory to apply a wafer etc. of silicon semiconductor.

Figure 27:
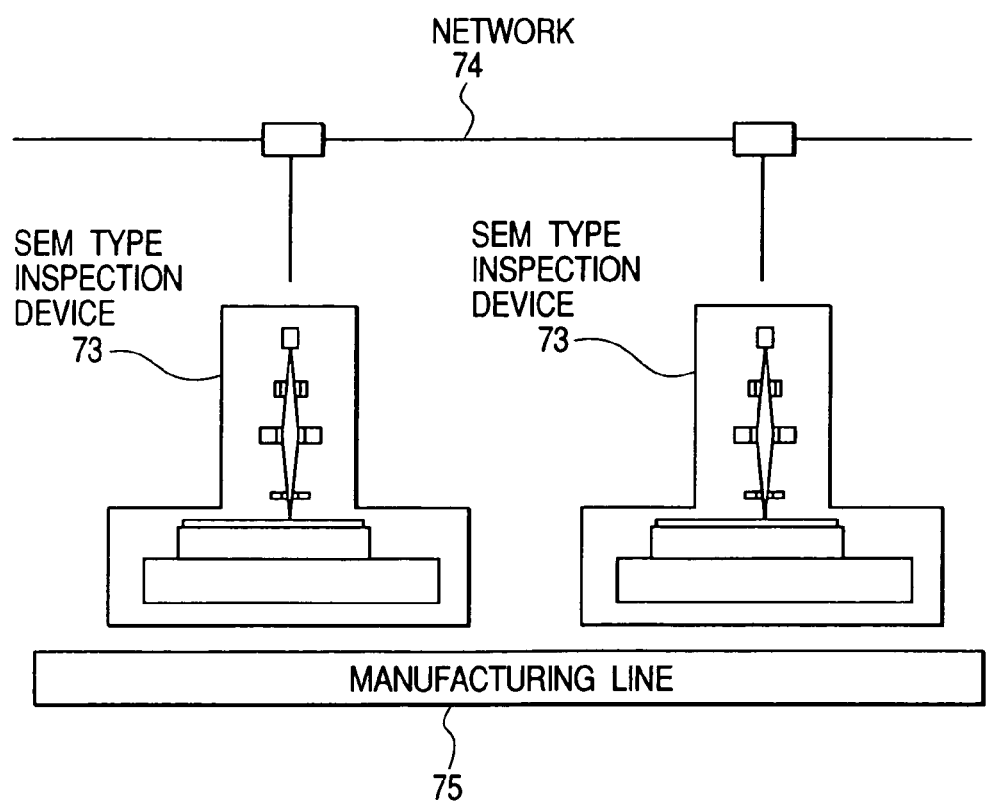
FIG. 27 is a top plan view for showing a schematic constitution of the production line into which a plurality of SEM type inspection devices are introduced.

With such an arrangement as above, a machine difference between the inspection devices can be evaluated in respect to a plurality of SEM type inspection devices. For example, as shown in FIG. 27, if SEM type inspection devices 73 used on production line 75 are connected to each other through network 74, giving or receiving data between the devices can be facilitated.

According to the present invention, it becomes possible to monitor the state of process for processing the inspected object, in particular the sate of forming the conductor pattern by evaluating the charged particles beam image obtained by photographing the inspected object with the SEM type inspection device. Further, it is possible to monitor the state of processing for processing the processed object including the inspected object in the manufacturing line by performing a continuous observation of the charged particles beam image of the inspected objects processed in sequence and thus it is possible to keep a stable processing. Additionally, when the variation in the process is detected by the monitor, it is possible to perform an early countermeasure against cause of variation and thus to prevent a large amount of defected products from being manufactured.

In addition, it is possible to realize a stable comparison inspection having no nuisance and showing a high sensitivity by setting an inspection threshold not detecting any non-coincidence between the inspected images that are charged particles beam image upon photographing them by the SEM type inspection device. Further, since setting of the inspection condition is easily performed, it is possible to shorten the condition setting time.

Additionally, it becomes possible to set the image processing condition for taking out a performance of the inspection device to its maximum degree in an easy manner by applying means for displaying non-coincidence between the inspected images in a visible apparent manner and by setting the minimum inspection threshold value not detecting the non-coincidences which are not defects in reference to information of non-coincidence.

Moreover, continuous evaluation of the state of the non-coincidence caused by the image detection system may provide the effect of recognizing the state of the device, detecting defects, and achieving a stable inspection.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of inspecting a pattern comprising the steps of:
   radiating and scanning charged particle beam to a region including a first pattern formed on an object to be inspected;
   detecting secondary charged particles generated from a region including said first pattern by scanning and radiating said charged particle beam to obtain a first charged particles image;
   radiating and scanning said charged particle beam to a region including a second pattern formed originally to have the same shape as that of said first pattern formed on said object to be inspected;
   detecting secondary charged particles generated from a region including said second pattern by scanning and radiating said charged particle beam to obtain a second charged particles image; and
   comparing said first charged particles image with said second charged particles image to detect either defect or a candidate for defect of the pattern formed on said object to be inspected; wherein
   at the step for detecting either the defect or candidate for defect of said pattern, estimating both a dispersion of amount of image signal in said first charged particles image and a dispersion of amount of image signal in said second charged particles image, calculating an allowable range based on the dispersion of said estimated amount of image signal, calculating a difference between said first charged particles image and said second charged particles image, and determining either a defect or a candidate for defect based on determination whether or not said calculated difference is within said calculated allowable range.

2. The method of inspecting a pattern according to claim 1, wherein a difference between said first charged particles image and said second charged particles image is calculated, after matching the position between said first charged particles image and said second charged particles image and calculating non-coincidence between said first charged particles image and said second charged particles image of which positions are matched as a difference between both images.

3. A method of inspecting a pattern comprising the steps of:
   radiating and scanning an electron beam on an object to be inspected;
   detecting secondary charged particles generated from the pattern formed on said object to be Inspected by the radiating and scanning of said electron beam to obtain an image of the pattern according to the detected secondary charged particles;
   detecting an intensity of said image of the pattern of said object to be inspected;
   setting a threshold value depending on the detected intensity of said image; and
   detecting either a defect or a candidate for defect of the pattern by processing said image of the pattern using said set threshold value.

4. The method of inspecting a pattern according to claim 3, wherein said setting the threshold value includes a step of setting a threshold value for a difference image between images of patterns being obtained by detecting a secondary charged particle generated from each of the patterns which are formed by same shape originally on said object.

5. A method of inspecting a pattern comprising the steps of:
   radiating and scanning an electron beam to a first region on object to be inspected to obtain a first image of said first region based upon detection of generated secondary charged particles;
   radiating and scanning an electron beam to a second region on said object to be inspected to obtain a second image of said second region based upon detection of secondary charged particles;
   comparing said first image with said second image to obtain a difference image between said first and second images;
   detecting an intensity of at least one of said first and second images; and
   detecting either a defect or a candidate for defect of the pattern formed on said object to be inspected by processing said difference image by using a threshold value corresponding to the detected intensity of the at least one of said first and second images.

6. The method of inspecting a pattern according to claim 5, wherein said threshold value is set based on a noise component among noise components caused by an image detecting system, and brightness of said first or second image.

7. A method of inspecting a pattern comprising the steps of:
   radiating and scanning an electron beam to each of patterns designed to have a same shape which are formed on an object to be inspected;
   detecting secondary charged particles generated from each of said patterns by radiating and scanning to obtain each of images according to the detected secondary charged particles;
   obtaining a difference image of each of said obtained images;
   detecting a brightness of said obtained images;
   extracting a defect of the pattern formed on the object from said difference image by using a plurality of threshold values set up according to the detected brightness of said obtained images.

8. The method of inspecting a pattern according to claim 1,3,5 or 7, wherein said threshold value set has a large threshold value for a part of the pattern which is bright or has a small threshold value for a part of the pattern which is dark.

9. The method of inspecting a pattern according to claim 7, wherein said threshold value is defined in response to any one of a signal amount of the secondary charged particles, a variation of said signal amount, a signal amount of difference image, a variation of the signal amount of said difference image, and information on region of a circuit pattern of said object to inspected, or any optional combination of these items.

10. An apparatus for inspecting a pattern comprising:
    charged particles optical system means for radiating and scanning charged particle beam on object to be inspected to obtain a charged particles image of said object to be inspected, the charged particles optical system means further comprising:

charged particle beam radiating/scanning section for radiating and scanning charged particle beam on said object to be inspected;

a secondary charged particles image detecting section for detecting the secondary charged particles generated from said object to be inspected with charged particle beam radiated and scanned on said object to be inspected at said charged particle beam radiating/scanning section to obtain a secondary charged particles image; and a memory section for storing a charged particles image of first pattern originally formed to have a same shape on said object to be inspected which is detected at said secondary charged particles image detecting section, and a charged particles image of second pattern; and a defect detecting means for processing the charged particles image of said object to be inspected obtained by said charged particles optical system means and detecting a defect of pattern formed on said object to be inspected, the defect detecting means further comprising:

a difference image producing section for producing a difference image between the charged particles image of the first pattern stored in the memory section of said charged particles optical system means and the charged particles image of said second pattern;

a threshold value setting section for setting a threshold value depending on a level of signal of charged particles images of the first pattern and the second pattern; and a defect detecting section for processing said difference image by using the threshold value set at said threshold value setting section and detecting either a defect or a candidate for defect of the pattern formed on said object to be inspected.

11. The apparatus for inspecting a pattern according to claim 10, wherein said difference image producing section of said defect detecting means is comprised of an alignment section for correcting a displacement between said first charged particles image and said second charged particles image; and an image producing section for producing a difference image by comparing the first charged particles image with said second charged particles image of which positions are aligned to each other at said alignment section.

12. An apparatus for inspecting a pattern comprising:

image taking means for obtaining an image of a pattern of an object to be inspected by radiating and scanning an electron beam on the object to be Inspected;

memory means for storing a reference image;

difference image producing means for producing a difference image between the image of said pattern of the object to be inspected obtained by said image taking means and said reference image stored in said memory means;

threshold value memory means for storing a plurality of threshold values of the difference images;

intensity detection means for detecting an intensity of said image of said pattern of the object to be inspected which is obtained by said image taking means;

threshold value setting means for setting a threshold value among said stored plurality of threshold values based upon the detected intensity of said image detected by said intensity detection means; and defect detecting means for detecting a defect of said pattern by evaluating the difference image produced by said difference image producing means by using the threshold value set by said threshold value setting means.

13. The apparatus for inspecting a pattern according to claim 12, wherein the reference image stored in said memory means is an image of the pattern of said object to be inspected obtained by taking an image by means of said image taking means.

14. The apparatus for inspecting a pattern according to claim 12, wherein a plurality of threshold values stored in said threshold value storing means are different depending on brightness of the images obtained by said image taking means.

15. The apparatus for inspecting a pattern according to claim 12, wherein a plurality of threshold values stored in said threshold value storing means are different depending on a feature of candidate for defect included in the difference image produced by said difference image producing means.

16. A method for processing a substrate, for forming a pattern in sequence through a plurality of processes, comprising the steps of;

radiating and scanning an electron beam on a surface of a processed substrate processed by a predetermined process of a plurality of processes for processing the substrate to obtain an image of the surface of said processed substrate based upon detection of secondary charged particles;

evaluating a dispersion of brightness of said image; and correcting said predetermined process by using said evaluated result.

17. The method for processing a substrate according to claim 16, wherein a dispersion of brightness of said image is compared and evaluated among a plurality of processed substrates.

18. A method for processing a substrate for forming a pattern in sequence through a plurality of processes, comprising the steps of:

radiating and scanning an electron beam on the surface of the substrate processed by a predetermined process of said plurality of processes for processing the substrate to obtain an image of the surface of said processed substrate based upon detection of secondary charged particles;

evaluating a dispersion of brightness of said image; and correcting processes subsequent to said predetermined process by using said evaluated result.

19. The method for processing a substrate according to claim 18, wherein dispersions of brightness of said image are compared among a plurality of processed substrates and evaluated.

20. A method for processing a substrate, for forming a pattern in sequence through a plurality of processes, comprising the steps of:

radiating and scanning an electron beam on a surface of a first substrate processed by a predetermined process in said plurality of processes to obtain a first charged particles image .of the surface of said first substrate;

storing said first charged particles image;

radiating and scanning an electron beam on a surface of a second substrate processed by said predetermined process to obtain a second charged particles image of the surface of said second substrate;

comparing said second charged particles image with said stored first charged particles image to obtain a difference image therebetween; and correcting said predetermined process by using information obtained by processing said obtained difference image with a threshold value according to a noise component of said difference image.

21. The method of inspecting a pattern according to claim 1, wherein the charged particle beam radiated and scanned is an electron beam and at the step of detecting, the dispersion of amount of image signal which is estimated is a dispersion of intensity of the image signal.

22. The method of inspecting a pattern according to claim 21, wherein the step of calculating the difference between the first charged particles image and the second charged particles image further includes a step of aligning positions between the first image and the second image and a step of calculating non-coincidence between the aligned first and second images as the difference between the first and second images.

23. The method of inspecting a pattern according to claim 3, wherein the threshold value is determined for each pixel of said image.

* * * * *